US011307539B1

United States Patent
Al-Saggaf et al.

(10) Patent No.: US 11,307,539 B1
(45) Date of Patent: Apr. 19, 2022

(54) METHOD OF EXTENDED STATE OBSERVER BASED FRACTIONAL ORDER CONTROLLER DESIGN FOR INTEGER HIGH ORDER SYSTEMS

(71) Applicant: King Abdulaziz University, Jeddah (SA)

(72) Inventors: Ubaid M. Al-Saggaf, Jeddah (SA); Abdulrahman U. Alsaggaf, Jeddah (SA); Muhammad Moinuddin, Jeddah (SA); Maamar Bettayeb, Sharjah (AE); Rachid Mansouri, Tizi Ouzou (DZ)

(73) Assignee: King Abdulaziz University, Jeddah (SA)

( * ) Notice: Subject to any disclaimer, the term of this patent is extended or adjusted under 35 U.S.C. 154(b) by 0 days.

(21) Appl. No.: 17/398,651

(22) Filed: Aug. 10, 2021

(51) Int. Cl.
G05B 6/02 (2006.01)
H03G 3/30 (2006.01)

(52) U.S. Cl.
CPC ............. G05B 6/02 (2013.01); H03G 3/3089 (2013.01)

(58) Field of Classification Search
CPC ................................ G05B 6/02; H03G 3/3089
See application file for complete search history.

(56) References Cited

U.S. PATENT DOCUMENTS

| | | | | |
|---|---|---|---|---|
| 2009/0005886 A1* | 1/2009 | Gao | ............ | G06F 17/10 700/29 |
| 2009/0143871 A1* | 6/2009 | Gao | ............ | G05B 13/04 700/29 |

FOREIGN PATENT DOCUMENTS

CN 111464073 A 7/2020

OTHER PUBLICATIONS

Han, J., From PID to Active Disturbance Rejection Control. IEEE Transactions on Industrial Electronics, vol. 56, Issue 3, pp. 900-906, Mar. 2009, [online], [retrieved on Dec. 9, 2021], Retrieved from the Internet (Year: 2009).*

Wu, D et al., Design and Analysis of Precision Active Disturbance Rejection Control for Noncircular Turning Process. IEEE Transactions on Industrial Electronics, vol. 56, Issue 7, pp. 2746-2753, Jul. 2009, [online], [retrieved on Dec. 9, 2021], Retrieved from the Internet (Year: 2009).*

(Continued)

*Primary Examiner* — Kenneth M Lo
*Assistant Examiner* — Mohammed Shafayet
(74) *Attorney, Agent, or Firm* — Oblon, McClelland, Maier & Neustadt, L.L.P.

(57) ABSTRACT

A method and system for set point tracking control of an $n^{th}$ order integer control system. A first feedback compensated input signal is generated from an input signal, r(t), and a first negative feedback signal. A fractional order controller generates a set point modified signal from the first feedback compensated input signal. A second feedback compensated input signal is generated from the set point modified signal and a second negative feedback signal. A process variable is generated from the second feedback compensated input signal and applied to a non-linear plant which is affected by a disturbance which carries over into an output signal, y(t). An extended state observer receives the process variable and the output signal and generates the first second negative feedback and the second negative feedback signal to cancel the disturbance.

14 Claims, 14 Drawing Sheets

(56) References Cited

OTHER PUBLICATIONS

Jiacai Huang, et al., "Research on Position Servo System Based on Fractional-Order Extended State Observer", IEEE Access, vol. 6, 2020, pp. 102748-102756.

Qiang Gao, et al., "Extended state observer-based fractional order proportional-integral-derivative controller for a novel electro-hydraulic servo system with iso-actuation balancing and positioning", Advances in Mechanical Engineering, vol. 7, No. 12, 2015, pp. 1-11.

* cited by examiner

METHOD OF EXTENDED STATE OBSERVER BASED FRACTIONAL ORDER CONTROLLER DESIGN FOR INTEGER HIGH ORDER SYSTEMS

STATEMENT OF ACKNOWLEDGEMENT

The inventors extend their appreciation to the Deputyship for Research and Innovation, Ministry of Education in Saudi Arabia for funding this research work through the project number 2020-075 and King Abdulaziz University, DSR, Jeddah, Saudi Arabia.

BACKGROUND

Technical Field

The present disclosure is directed to a controller, system, and a fractional order controller design for integer high order systems based on an extended state observer, and a method for set point tracking control of high order integer control system.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Fractional calculus has applications in a number of science and engineering fields, such as signal processing and control systems. Further, many naturally existing processes, such as charging and discharging of lossy capacitors, flow of fluid in a porous media, conduction of heat in a semi-infinite slab, voltage-current relation in a semi-infinite transmission line, and non-Fickian diffusion, can be more accurately modeled using fractional order differential equations.

Fractional order controllers, for example, a proportional-integral-derivative fractional order filter (PID-FOF) controller, are used to control integer and fractional order systems, as the closed-loop response of the PID-FOF controllers is more accurate than that of a classical PID control system. Researchers have shown interest in developing effective tuning techniques for non-integer order controllers and new control schemes based on fractional order controllers As plant uncertainties and internal/external disturbances are unknown, new control schemes have been proposed for industrial control systems. Several data-driven or model-free design techniques have been proposed to overcome the plant uncertainties and internal/external disturbances, for example, an active disturbance rejection controller (ADRC). The ADRC takes into consideration both the unknown unmodeled dynamics, also called internal disturbance, and the external perturbation as general disturbances, and actively rejects them. A well-tuned state feedback control is then used to solve a set point tracking problem of a controller. However, the ADRC controller lacks robustness and dynamic performance.

Additionally, both a fractional-order dynamics rejection scheme (FODRS) and a fractional linear active disturbance rejection controller (FLADRC) have been proposed to minimize the disturbances by generalizing the ADRC scheme to fractional order systems. In FODRS, a fractional order model is transformed into an integer order model, and fractional order dynamics are included into the generalized disturbance, which is then actively rejected. In FLADRC, a conventional linear active disturbance rejection control (LADRC) scheme is generalized to a fractional order model. Since the system to be controlled is fractional, a fractional order extended state observer (FESO) is used to estimate the disturbance. However, both the FODRS and FLADRC control schemes suffer from poor robustness and dynamic performance.

Further, an ADRC scheme has been proposed that takes into consideration model uncertainties of a fractional order system. However, the ADRC scheme requires a known model order of the system to be controlled.

Another ADRC scheme includes an integer order model of a system to be controlled to first be transformed to a non-integer order model. A commensurate FESO is then used to estimate the generalized disturbance. A non-commensurate state feedback control circuit is also used in the ADRC scheme to solve the set point tracking problem of a controller. However, this ADRC-FESO scheme suffers from poor dynamic performance and robustness.

Additionally, a control strategy for a position servo system is based on a fractional-order extended state observer (FOESO), which is combined with a fractional order control law to form a fractional-order active disturbance rejection controller (FOADRC). The FOADRC controls to a positioning loop of the servo system. (See: Jiacai Huang, Peng Ma, Guangxuan Bao, Fangzheng Gao, and Xinxin Shi, "Research on position servo system based on fractional-order extended state observer", Received May 4, 2020, accepted May 20, 2020, date of publication May 25, 2020, date of current version Jun. 11, 2020, Digital Object Identifier 10.1109/ACCESS.2020.2997407, incorporated herein by reference in its entirety). However, this reference has the drawback of not estimating and rejecting the disturbances efficiently and having slower transient response.

Further, an extended state observer-based fractional order proportional-integral-derivative controller has been proposed. (See: Qiang Gao, Yuanlong Hou, Tongbin Deng, Chao Wang, and Runmin Hou, "Extended state observer-based fractional order proportional-integral-derivative controller for a novel electro-hydraulic servo system with iso-actuation balancing and positioning", Advances in Mechanical Engineering 2015, Vol. 7(12) I-II, DOI: 10.1177/1687814015620736, incorporated herein by reference in its entirety). However, this reference has the drawback of not estimating and rejecting the disturbances efficiently and having slower transient response.

Each of the aforementioned references suffers from one or more drawbacks hindering their adoption. Accordingly, it is one object of the present disclosure to provide methods and systems for set point tracking including an extended state observer based fractional order control (ESO-FOC) for integer high order systems.

SUMMARY

In an exemplary embodiment a set point tracking system for an $n^{th}$ order integer plant is disclosed. The system includes a set point tracking loop which includes a first multiplier configured to receive an input signal, r(t), and a first negative feedback signal, $z_1(t)$, and generate a first feedback compensated input signal. The set point tracking loop further includes a fractional order controller connected to the first multiplier to receive the first feedback compensated input signal and generate a set point modified signal, $u_0(t)$. The set point tracking loop further includes a second multiplier configured to receive the set point modified signal, $u_0(t)$, and a second negative feedback signal, $z_3(t)$, and generate a second feedback compensated input signal. The set point tracking loop further includes an inverse static gain amplifier, $b_0^{-1}$, configured to receive the second feedback compensated input signal and generate a process variable, $u(t)$. The set point tracking loop further includes a third multiplier configured to receive the process variable, $u(t)$, and a disturbance, d, and generate a disturbed process variable. The set point tracking loop further includes a non-linear plant model configured to receive the disturbed process variable and generate an output signal, $y(t)$. The set point tracking loop further includes an extended state observer configured to receive the process variable, $u(t)$, and the output signal, $y(t)$, and generate the first negative feedback signal, $z_1(t)$, and the second negative feedback signal, $z_3(t)$.

In another exemplary embodiment, a method for set point tracking control of an nth order integer plant method is disclosed. The method includes receiving, by a first multiplier, an input signal, $r(t)$. The method further includes generating, by the first multiplier, a first feedback compensated input signal from the input signal, $r(t)$, and a first negative feedback signal, $z_1(t)$. The method further includes generating, by a fractional order controller, a set point modified signal, $u_0(t)$ from the first feedback compensated input signal. The method further includes receiving, by a second multiplier, the set point modified signal, $u_0(t)$, and a second negative feedback signal, $z_3(t)$. The method further includes generating, by the second multiplier, a second feedback compensated input signal from the set point modified signal, $u_0(t)$, and the second negative feedback signal, $z_3(t)$. The method further includes generating, by an inverse static gain amplifier, $b_0^{-1}$, a process variable, $u(t)$ from the second feedback compensated input signal. The method further includes receiving, by a third multiplier, the process variable, $u(t)$, and a disturbance, d. The method further includes generating, by the third multiplier, a disturbed process variable from the process variable, $u(t)$, and the disturbance, d. The method further includes applying the disturbed process variable to a non-linear plant model and generating an output signal, $y(t)$. The method further includes receiving, by an extended state observer, the process variable, $u(t)$, and the output signal, $y(t)$. The method further includes generating, by the extended state observer, the first negative feedback signal, $z_1(t)$, and the second negative feedback signal, $z_3(t)$.

In another exemplary embodiment, a non-transitory computer readable medium having instructions stored therein that, when executed by one or more processors, cause the one or more processors to perform a method of set point tracking control of an nth order integer plant. The method includes receiving, by a first multiplier, an input signal, $r(t)$. The method further includes generating, by the first multiplier, a first feedback compensated input signal from the input signal, $r(t)$, and a first negative feedback signal, $z_1(t)$. The method further includes generating, by a fractional order controller, a set point modified signal, $u_0(t)$ from the first feedback compensated input signal. The method further includes receiving, by a second multiplier, the set point modified signal, $u_0(t)$, and a second negative feedback signal, $z_3(t)$. The method further includes generating, by the second multiplier, a second feedback compensated input signal from the set point modified signal, $u_0(t)$, and the second negative feedback signal, $z_3(t)$. The method further includes generating, by an inverse static gain amplifier, $b_0^{-1}$, a process variable, $u(t)$ from the second feedback compensated input signal. The method further includes receiving, by a third multiplier, the process variable, $u(t)$, and a disturbance, d. The method further includes generating, by the third multiplier, a disturbed process variable from the process variable, $u(t)$, and the disturbance, d. The method further includes applying the disturbed process variable to a non-linear plant model and generating an output signal, $y(t)$. The method further includes receiving, by an extended state observer, the process variable, $u(t)$, and the output signal, $y(t)$. The method further includes generating, by the extended state observer, the first negative feedback signal, $z_1(t)$, and the second negative feedback signal, $z_3(t)$.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
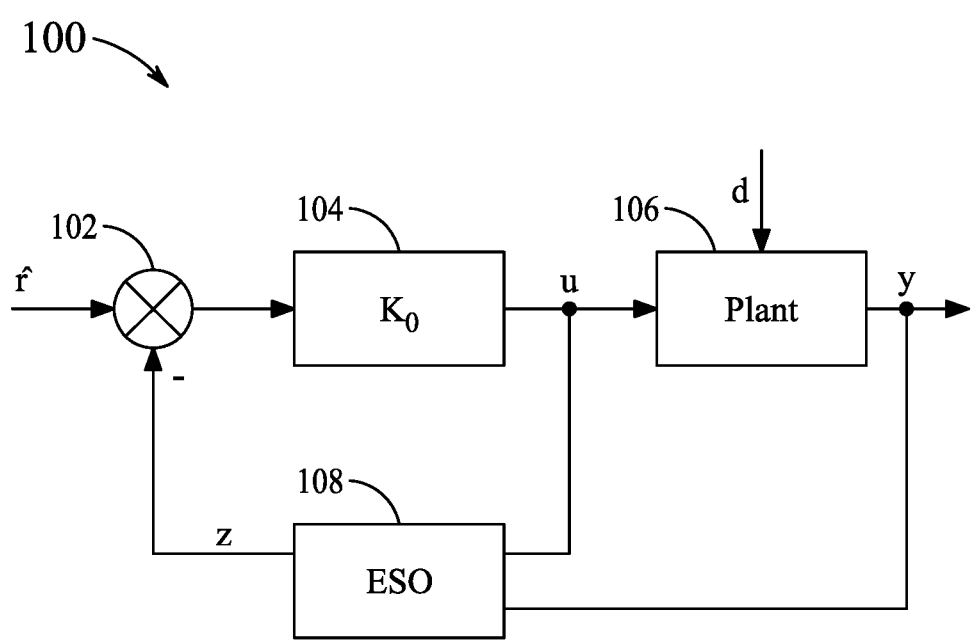
FIG. 1 is a block diagram of a conventional LADRC system, according to certain embodiments.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Aspects of this disclosure are directed to methods and system for extended state observer based fractional order controller design for integer high order systems.

FIG. 1 illustrates a conventional linear active disturbance rejection control (LADRC) system 100 including a feedback control loop having an extended state observer (ESO) 108. The conventional LADRC system 100 comprises an amplifier 104 with a gain, $K_0$, a plant (or a system) 106 to be controlled, and the extended state observer (ESO) 108. The conventional LADRC system 100 further comprises a multiplier 102 in a forward path of a closed loop of the conventional LADRC system 100. The amplifier 104 is a component having a gain ($K_0$) configured to amplify an input signal. The plant 106 may be a circuitry, machinery or a system experiencing disturbances that are to be controlled. The ESO 108 is configured to estimate and cancel the disturbances.

In operation, an input signal, $\hat{r}$, is input to the multiplier 102. The multiplier 102 also receives a negative feedback input, z, from the ESO 108. The amplifier 104 with an amplifier gain, $K_0$, amplifies a resultant signal obtained from the multiplier 102 to generate a signal, u.

The signal, u, is input to the plant 106. The signal, u, is affected by a disturbance, d, due to non-linearity in the plant 106 operation. The plant 106 generates an output signal, y.

The output signal, y, and the signal, u, are input to the ESO 108. The ESO 108 estimates a generalized disturbance which may include one or more of external disturbances including, the disturbance, d, unknown internal dynamics of the conventional LADRC system 100, and uncertainty in the gain of the conventional LADRC system 100. The ESO 108 generates the negative feedback input, z, based on the estimated generalized disturbance. The negative feedback input, z, is input to the multiplier 102, to cancel the generalized disturbance.

The conventional LADRC system 100 and the plant 106 to be controlled may be modeled by:

$$d^n y(t) = b_0 u(t) + f(t) \tag{1}$$

where:
$d^n y(t)$ is the $n^{th}$ derivative of y(t),
$f(t)=f(t, y^{(i)}, u^{(i)}, d^{(i)}, d)+(b-b_0)u(t)$ is the unknown generalized disturbance, u(t), y(t), and d(t) are the input, the output, and the external disturbance, respectively, of the plant 106,
n is the relative degree, and
$b_0$ is the estimate value of the system gain, b.

In the conventional LADRC system 100, the unknown generalized disturbance f(t) is assumed to be differentiable and is estimated using the Luenberger extended state observer (ESO) given by:

$$\begin{cases} \dot{z}(t) = A\,z(t) + B\,u(t) + L(y(t) - y_0(t)) \\ y_0(t) = Cz(t) \end{cases} \tag{2}$$

where:

$$z(t) = [y(t)\ \dot{y}(t)\ \ldots\ d^{n-1}y(t)\ f(t)]^T,$$

$$A = \begin{bmatrix} 0 & 1 & 0 & \ldots & 0 \\ 0 & 0 & 1 & \ldots & 0 \\ \vdots & \vdots & \vdots & \ddots & \vdots \\ 0 & 0 & 0 & \ldots & 1 \\ 0 & 0 & 0 & \ldots & 0 \end{bmatrix}, B = \begin{bmatrix} 0 \\ 0 \\ \vdots \\ b_0 \\ 0 \end{bmatrix}, \text{and } C = [1\ 0\ 0\ \ldots\ 0]$$

A gain vector L of the ESO 108 is:

$$L = [\beta_1 \beta_2\ \ldots\ \beta_n \beta_{n+1}] \tag{3}$$

Parameters $\beta_i$, (i=1, n+1) are determined such that (A-LC) is asymptotically stable. Variables $z_i(t)$, (i=1, ..., n) approximate the output y(t) and (n-1) derivatives of the output y(t). The variable $z_{n+1}(t)$ approximates the unknown generalized disturbance f(t). The unknown generalized disturbance f(t) is canceled using the control law:

$$u(t) = \frac{u_0(t) - z_{n+1}(t)}{b_0} \tag{4}$$

where: $u_0$ is the new input to solve a set point tracking problem of the plant 106.

The model, as represented by equation (1), of the plant 106 is then reduced to n cascaded integer-order integral operators, represented by:

$$d^n y(t) = u_0(t) \tag{5}$$

In the formulation of the LADRC system 100, a state feedback is used to solve the set point tracking problem. The control law u(t) is given by:

$$u(t) = K_0(\hat{r}(t) - z(t)) \tag{6}$$

where $\hat{r}(t)$ is the new reference signal obtained from the reference signal r(t) and its (n-1) derivatives.

$$\hat{r}(t) = [r(t)\dot{r}(t)\ \ldots\ r^{(p-1)}(t)0]^T \tag{7}$$

and $$K_0 = [k_1 k_2\ \ldots\ k_n 1]/b_0 \tag{8}$$

The conventional LADRC system 100 has two gain vectors to design: the gain L of the ESO 108 and a gain $K_0$ of the plant 106.

The conventional LADRC system lacks robustness and dynamic performance. Weighted Bode's Ideal Transfer Function:

In an aspect of the present disclosure, in order to make the control system more robust, an ideal transfer function (ITF) proposed by Bode is chosen as a reference model to a closed-loop transfer function.

An open-loop Bode's ideal transfer function (BITF) is given by:

$$BITF_{ol}(s) = \frac{1}{\tau_c s^{\lambda+1}} \quad 0 < \lambda < 1 \tag{9}$$

The closed-loop Bode's ideal transfer function (BITF) is given by:

$$BITF_{cl}(s) = \frac{1}{1 + \tau_c s^{\lambda+1}} \quad 0 < \lambda < 1 \tag{10}$$

where:
$\tau_c$ characterizes transient of step response, and $\lambda$ characterizes overshoot of the step response.

To achieve the objectives of set point tracking control and robustness when designing a fractional order controller, i.e., when the system or plant to be controlled is of order 1 or 2, the model as represented by equation (10) is sufficient to be a reference model for the closed loop transfer function. However, when the system or plant to be controlled is of high order, the model as represented by equation (10) may not be appropriate to develop an analytical method to design the fractional order controller. Therefore, when the system or plant to be controlled is of high order, the reference model is given by:

$$G_{ol}(s) = \frac{1}{\tau_c s^{\lambda+1}(1+Ts)^r} \quad 0 < \lambda < 1 \tag{11}$$

where:
T is the time constant of the filter and r is a positive integer number.

The characteristics of the reference model $G_{ol}(s)$ of equation (11) are similar to those of the $BITF_{ol}(s)$ of Equation (9). The order for the model as represented by equation (11), may be adjusted according to the model order of the system or plant to be controlled. To make the characteristics of $G_{ol}(s)$ similar to those of $BITF_{ol}(s)$, T is chosen smaller than $\tau_c$.

Figure 2:
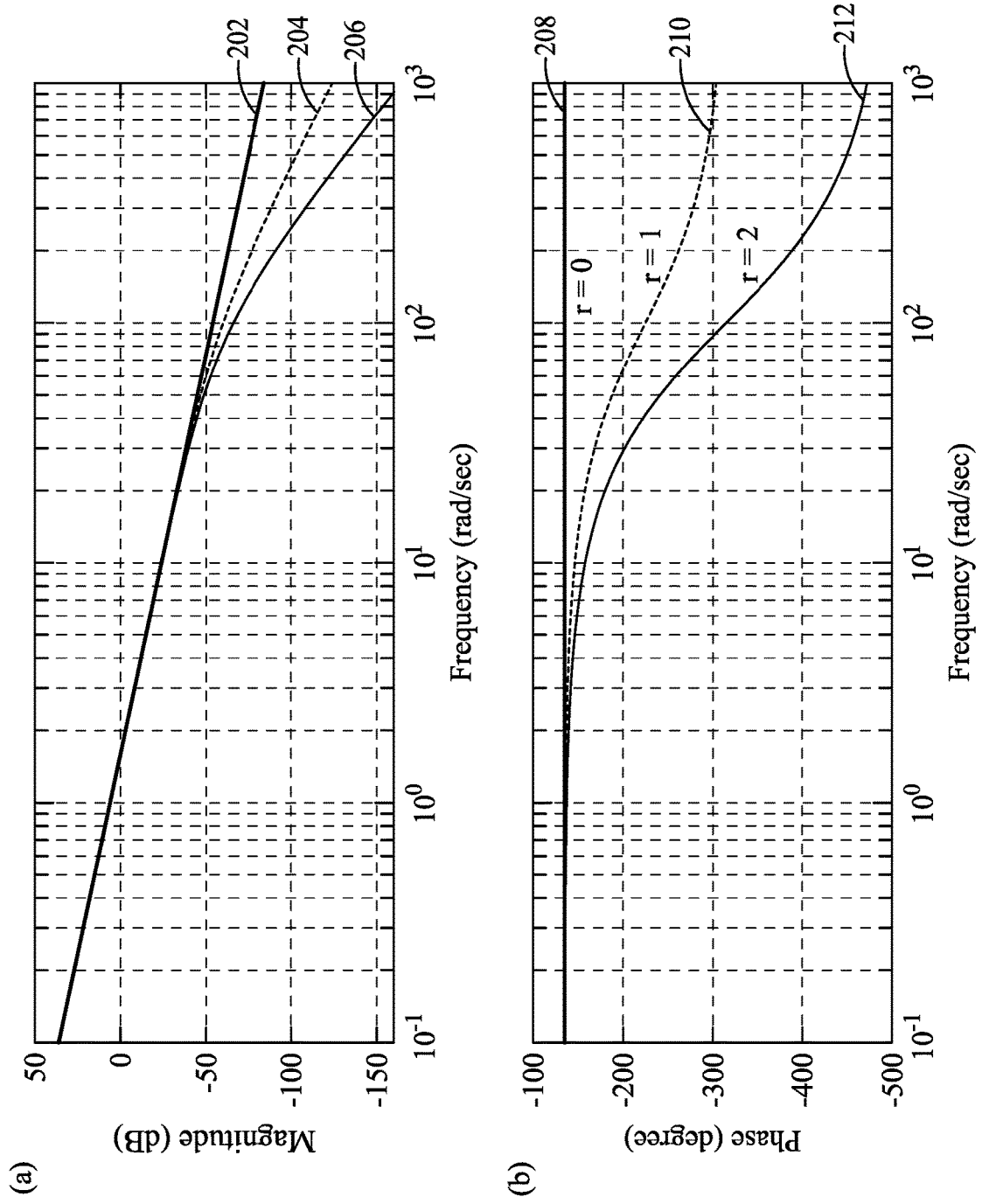
FIG. 2 shows graphs of a Bode plot for a weighted Bode ideal transfer function for orders 0, 1, and 2, for (a) magnitude versus frequency and (b) phase versus frequency, according to certain embodiments.

FIG. 2 is a set of plots of the weighted Bode's ideal transfer function weighted by an integer first order filter with order 0, 1, and 2, where each of the order is assigned a corresponding weight. The Bode plot (a) of FIG. 2 depicts the magnitude vs. frequency plot of the reference model $G_{ol}(s)$ of equation (11) for $\tau_c=0.5$, $\lambda=0.5$, T=0.01, and r=0, 1, and 2. The curves 202, 204, and 206 represent the magnitude vs. frequency plot for r=0, r=1, and r=2, respectively. The Bode plot (b) of FIG. 2 depicts phase vs. frequency plot of the reference model $G_{ol}(s)$ of equation (11) for $\tau_c=0.5$, =0.5, T=0.01, and r=0, 1, and 2. The curves 208, 210, and 212 represent the phase vs. frequency plot for r=0, r=1, and r=2, respectively. The Bode plot (b) of FIG. 2 shows that near a gain crossover frequency, the phase of the weighted Bode's ideal transfer function is similar to that of Bode's ideal transfer function. The gain cross over frequency is the frequency at which the magnitude of signal becomes 1. The flatness of the bandwidth is higher when the value of T is smaller compared to $\tau_c$. This corresponds to an unchanged overshoot of the step response for any value of $\tau_c$. This characteristic, i.e., the unchanged overshoot of the step response for any value of $\tau_c$ is shown in FIG. 3.

Figure 3:
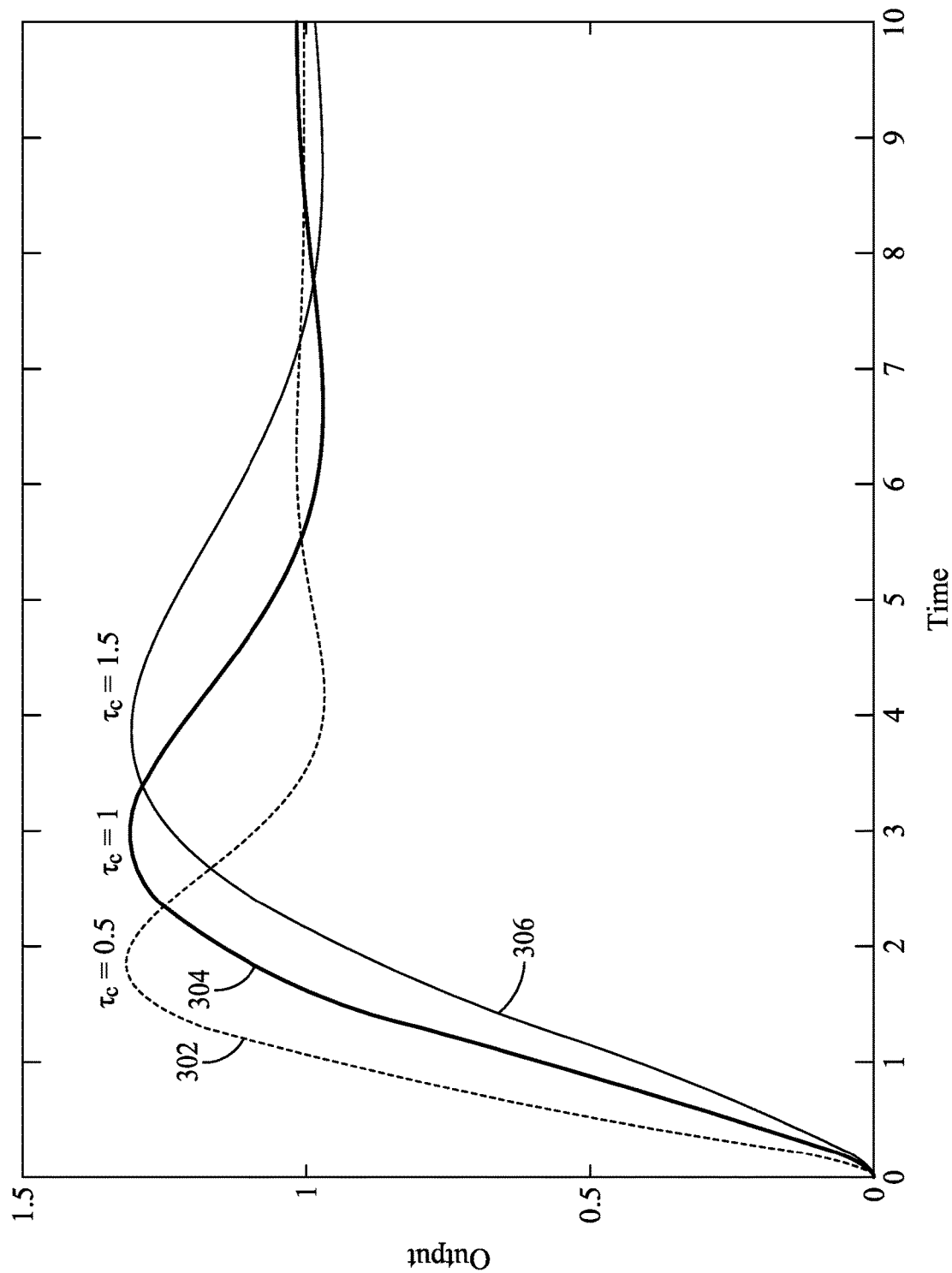
FIG. 3 is a graph of the step response of the closed-loop weighted Bode ideal transfer function over time, according to certain embodiments.

FIG. 3 shows the step response of the closed-loop weighted Bode's ideal transfer function. FIG. 3 shows the closed-loop step response of $G_{ol}(s)$ for $\lambda=0.5$, T=0.01, r=2, and three values of $\tau_c$, $\tau_c=0.5$, 1, and 1.5. The curves 302, 304, and 306 represent the step response for $\tau_c=0.5$, $\tau_c=1$, and $\tau_c=1.5$, respectively. As shown in FIG. 3, the transients of the step response depend on $\tau_c$, however, the overshoot remains unchanged for the three values of $\tau_c$. Thus, the overshoot depends only on the value of $\lambda$.

According to aspects of the present disclosure, an Active Disturbance Rejection Control (ADRC) framework based control system for an $n^{th}$ order integer plant is disclosed. Based on an Extended State Observer (ESO), the generalized disturbance is estimated and canceled. Further, a Fractional Order Controller is designed to solve the set point tracking problem. To enhance the robustness of the control system, a Bode's ideal transfer function (ITF) is imposed as a reference model on an open-loop. Further, to make design method of the control system simple and systematic, an Internal Model Control (IMC) design is used for the fractional order controller.

IMC Based Controller Design

The IMC is a comprehensive model-based design method which is based on an assumed process model and leads to analytical expressions for controller settings. The IMC based design method has the advantage of allowing model uncertainty and tradeoffs between performance and robustness to be considered in a more systematic way.

For the IMC based controller design, a process model is factored as:

$$G_m(s) = G_m^+(s) G_m^-(s) \tag{12}$$

where, $G_m^-(s)$ is a nonsingular part of $G_m(s)$ and $G_m^+(s)$ is a singular part of $G_m(s)$.

$G_m^+(s)$ contains time delay and right half plane (RHP) zeros of $G_m(s)$ and its steady-state gain must be equal to one. Thus, the steady-state gain of $G_m(s)$ depends on $G_m^-(s)$ which is used to design the controller. Therefore, the controller is specified as:

$$C_{IMC}(s) = \frac{1}{G_m^-(s)} G_{cl}(s) \tag{13}$$

where, $G_{cl}(s)$ is a low pass filter with a steady-state gain of one. $G_{cl}(s)$ has the form specified as:

$$G_{cl}(s) = \frac{1}{(1+\tau_c s)^r} \tag{14}$$

where, $\tau_c$ is the desired closed-loop time constant and parameter r is a positive integer chosen such that the controller is realizable.

The controller for conventional feedback control is given by:

$$C(s) = \frac{C_{IMC}(s)}{1 - C_{IMC}(s) G_m(s)} \tag{15}$$

Fractional Order Controller Design

According to aspects of the present disclosure, a general principle for designing a proportional-integral-derivative (PID)-Fractional Order Filter (FOF) controller leads to a closed-loop system with fractional behavior. Further, a simple design technique that meets the robustness objectives represented by the weighted Bode's ideal transfer function (WBITF) is also incorporated. The primary characteristic of this PID-FOF controller design is due to the closed-loop reference model, which results in robust and dynamic performance.

Figure 4:
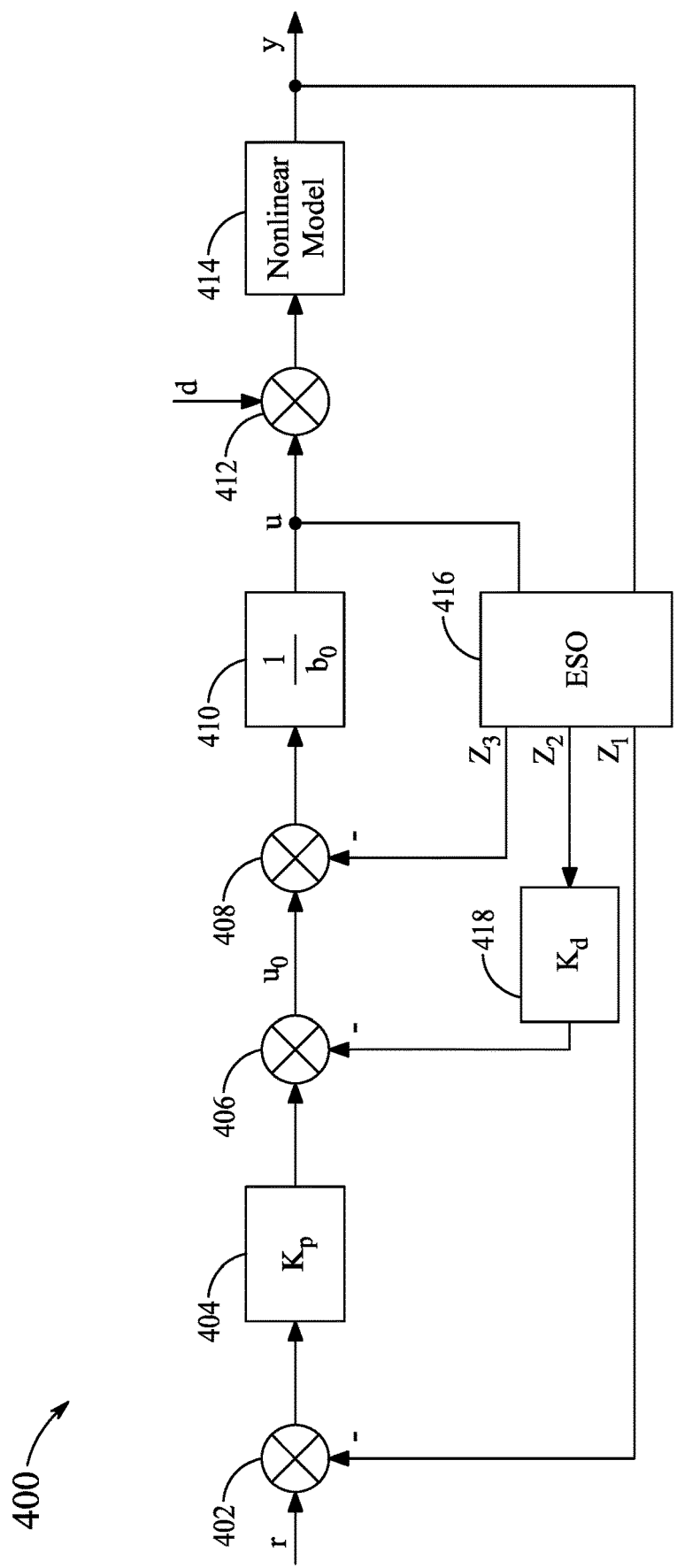
FIG. 4 is a block diagram for a simulation of a conventional LADRC system with a non-linear model, according to certain embodiments.

In the fractional order controller design for the conventional LADRC, shown in FIG. 4, the IMC Controller is first obtained using the relation in equation (13) which gives:

$$C_{IMC}(s) = \frac{s^n}{1 + \tau_c s^{\lambda+1}(1 + Ts)^{n-2}} \quad (16)$$

The conventional feedback controller C(s) from equation (15) is then transformed to:

$$C(s) = \frac{s^{n-2}}{(1+Ts)^{n-2}} \frac{1}{\tau_c} s^{1-\lambda} \quad (17)$$

where, the controller C(s) is a fractional order derivative cascaded with an integer order filter.

Figure 5:
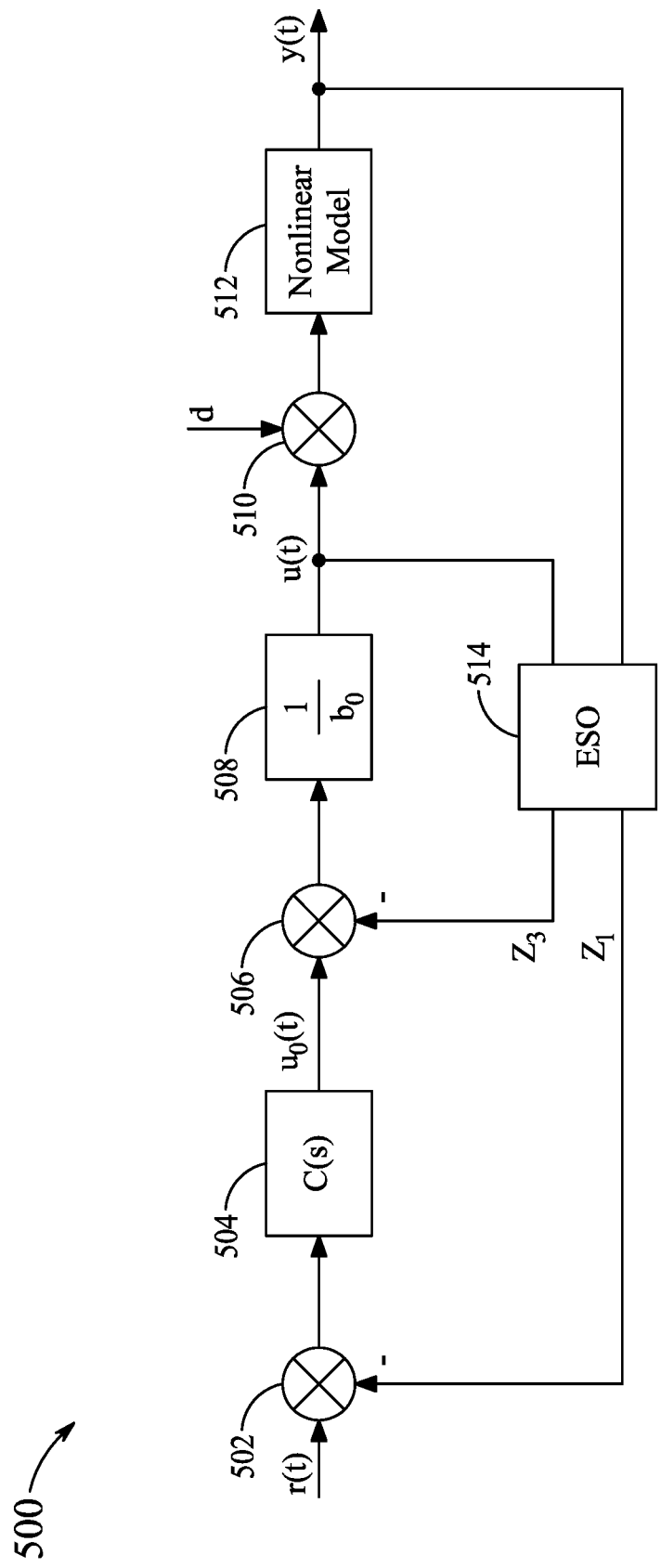
FIG. 5 is a block diagram for a simulation of an ESO based FOC system with a non-linear model, according to certain embodiments.

According to the aspects of the present disclosure, a closed loop PID-FOF-controller employing an IMC based fractional order control system is disclosed. This design is based on the principle of a weighted Bode's ideal transfer function. The control system shown in FIG. 5 illustrates the design of the closed loop PID-FOF-controller, having a fractional order controller 504. The closed loop PID-FOF-controller design procedure is summarized in the following steps:

Step 1—Based on the Luenberger ESO given by equation (2) and according to the control law given by equation (4), the process model for the IMC based controller design is transformed to:

$$G_m(s) = \frac{1}{s^n} \quad (18)$$

Step 2—To obtain iso-damping property allowed by transfer function given by equation (11), the following fractional order model $G_{cl}(s)$ is chosen as a reference model to the closed-loop system.

$$G_{cl}(s) = \frac{1}{1 + \tau_c s^{\lambda+1}(1+Ts)^{n-2}} \quad (19)$$

$$0 < \lambda < 1$$

where, the time constant $\tau_c$ and the non-integer $\lambda$ are chosen to impose the phase margin $\varphi_m$ and the gain crossover frequency $\omega_c$ of the closed-loop. Further, $$\lambda = \frac{\pi - \varphi_m}{\pi/2} - 1 \text{ and } \tau_c = \frac{1}{\omega_c^{\lambda+1}} \quad (20)$$

Step 3—According to equation (13), the IMC controller is specified as:

$$C_{IMC}(s) = \frac{s^n}{1 + \tau_c s^{\lambda+1}(1 + Ts)^{n-2}} \quad (21)$$

Step 4—The conventional feedback controller C(s) from equation (15) is then transformed to:

$$C(s) = \frac{s^{n-2}}{(1+Ts)^{n-2}} \frac{1}{\tau_c} s^{1-\lambda} \quad (22)$$

where the controller C(s) is a fractional order derivative cascaded with an integer order filter, T is a time constant of the integer order filter of the fractional order controller, and s is a Laplace transform of an output signal y(t).

The controller C(s) of equation (22) is a cascade of two derivative operators, one integer and the other fractional, however, the controller C(s) does not have an infinite gain at high frequencies. Thus, measurement noise is not amplified. In fact, the integer derivative operator is filtered by a low-pass filter (an approximation used in the PID controller). As illustrated in further detail, a CRONE approximation is used for the fractional order derivative operator in the simulation and implementation tasks, which solves the problem of infinite gain at high frequencies introduced by the fractional order derivative operator.

Further, simulation schemes of a) a conventional LADRC system for non-linear model and b) an ESO based PID-FOF controller system for the non-linear model are explained with reference to FIG. 4 and FIG. 5, respectively. Further, an experimental test in a real motion control environment of a cart-pendulum system is explained with reference to FIG. 8.

Crone's Approximation

To find a transfer function that approximates behaviour of fractional transfer function, a commonly used approximation method is the Crone approximation. The Crone approximation has N poles and N zeros within a frequency range $[\omega_l, \omega_h]$ and is given by:

$$s^z \approx C \prod_{m=1}^{N} \frac{1 + \frac{s}{\omega_{\zeta,m}}}{1 + \frac{s}{\omega_{\pi,m}}} \quad (A)$$

$$\omega_{\zeta,m} = \omega_l \left(\frac{\omega_h}{\omega_l}\right)^{\frac{2m-1-z}{2N}} \quad (B)$$

$$\omega_{\pi,m} = \omega_l \left(\frac{\omega_h}{\omega_l}\right)^{\frac{2m-1+z}{2N}} \quad (C)$$

where z is order of the fractional derivative, N is the number of poles and zeros within the frequency range $[\omega_l, \omega_h]$, C is gain, and s is a Laplace transform of the output signal, y.

If z is real, the correct gain at 1 rad/s, which is $|(j\omega)^\alpha|=1$, $\forall \alpha$ must be set by adjusting gain C. If z is complex, both gain and phase at 1 rad/s must be set by adjusting C. For simpler calculations, a frequency of 1 rad/s is chosen. If the frequency of 1 rad/s falls outside the range of $[\omega_l, \omega_h]$, any other suitable frequency may be used for calculation.

If z is less than one, the relation given by equation (A) is valid for the frequency range $[10\omega_l, 0.1\omega_h]$. Both gain and phase have ripples, which decrease as N increases. Typically, N should be at least equal to the number of decades in $[\omega_l, \omega_h]$ for acceptable results. When |z| is greater than one, the frequency range in which the approximation behaves acceptably becomes narrower, and approximations such as $s^z = s^{\lceil R(z) \rceil} s^{z-\lceil R(z) \rceil}$ or $s^z = s^{\lfloor R(z) \rfloor}$ (for which only the last term needs to be approximated) are employed, where R(z) is the real portion of z.

In the step of choosing the values of the gain crossover frequency, $\omega_c$, the phase difference between the input signal, r, and the output signal, y, must be constant within a frequency range between a minimum frequency, $\omega_L$, and a maximum frequency, $\omega_H$, wherein $\omega_L \leq \omega_C \leq \omega_H$. To achieve this aforesaid range, $\omega_L$ is chosen to be as small as possible and $\omega_H$ is chosen to be larger than $\omega_C$ but should not exceed in such a way that system noise is boosted.

FIG. 4 illustrates a circuit used to simulate a conventional LADRC system 400 for controlling non-linear model 414 of a device, such as a plant, servo system or moving device, and the like. The conventional LADRC system 400 comprises the non-linear model 414 of a plant or a system to be controlled, an amplifier 404 with a gain, $k_p$, an amplifier 410 having a gain, $1/b_0$, and an amplifier 418 with gain, $k_d$. The conventional LADRC system 400 also comprises a multiplier 402, a multiplier 406, a multiplier 408, and a multiplier 412 in a forward path of closed loop of the conventional LADRC system 400, and an extended state observer (ESO) 416.

In the conventional LADRC system 400, an input signal, r, is input to the amplifier 404 with gain, $k_p$ through the multiplier 402. The amplifier 404 amplifies the input signal, r, based on the amplifier gain, $k_p$. The amplifier 410 receives and further amplifies an amplified signal $u_0$ based on the amplifier gain $1/b_0$ to generate a signal, u. An input signal to the non-linear model 414, which is the signal, u, output from the amplifier 410, is affected with an input disturbance, d, as illustrated as another input to the multiplier 412. The resultant signal is applied to the non-linear model 414. The non-linear model 414 generates an output signal, y. The output signal, y, and the signal, u, are input to the ESO 416. The ESO 416 estimates a generalized disturbance which may include one or more of external disturbances (that is, the input disturbance, d), unknown internal dynamics of the conventional LADRC system 400, and uncertainty in the gain of the conventional LADRC system 400. Such generalized disturbances, i.e., $z_1$, $z_2$ and $z_3$, are input to the multiplier 402, the multiplier 406 via the amplifier 418 with gain, $k_d$, and to the multiplier 408, respectively, to cancel the generalized disturbance.

FIG. 5 illustrates a circuit used to simulate an extended state observer (ESO) based fractional order control (FOC) system 500 for controlling a device, such as a plant, servo system or moving device, and the like, represented as a non-linear model 512, according to exemplary aspects of the present disclosure. The ESO based FOC system 500 comprises the non-linear model 512, an inverse static gain amplifier 508 having a gain, $b_0^{-1}$, a first multiplier 502, a second multiplier 506, and a third multiplier 510 in a forward path of the ESO based FOC system 500, and an extended state observer (ESO) 514 in a closed feedback loop. The ESO based FOC system 500 further comprises a fractional order controller 504. In an aspect of the present disclosure, the ESO based FOC system 500 is a set point tracking system for an $n^{th}$ order integer plant.

In the ESO based FOC system 500, the first multiplier 502 receives an input signal, r(t), and a first negative feedback signal, $z_1(t)$, from the ESO 514. The first multiplier 502 generates a first feedback compensated input signal based on the input signal, r(t), and the first negative feedback signal, $z_1(t)$. The first multiplier 502 is connected to the fractional order controller 504. The fractional order controller 504 receives the first feedback compensated input signal from the first multiplier 502 and generates a set point modified signal, $u_0(t)$. The fractional order controller 504 is connected to the second multiplier 506. The second multiplier 506 receives the set point modified signal, $u_0(t)$, from the fractional order controller 504 and a second negative feedback signal, $z_3(t)$, from the ESO 514. The second multiplier 506 generates a second feedback compensated input signal based on the set point modified signal, $u_0(t)$, and the second negative feedback signal, $z_3(t)$. The second multiplier 506 is connected to the inverse static gain amplifier 508. The inverse static gain amplifier 508 receives the second feedback compensated input signal from the second multiplier 506 and generates a process variable, u(t). In an aspect of the present disclosure, the inverse static gain amplifier 508 applies the gain, $b_0^{-1}$, to the second feedback compensated input signal to generate the process variable, u(t). The inverse static gain amplifier 508 is connected to the third multiplier 510. The third multiplier 510 receives the process variable, u(t), from the inverse static gain amplifier 508 and a disturbance, d. The third multiplier 510 generates a disturbed process variable based on the process variable, u(t) and the disturbance, d. The third multiplier 510 is connected to the non-linear model 512. The non-linear model 512 receives the disturbed process variable from the third multiplier 510. The non-linear model 512 generates an output signal, y(t) from the disturbed process variable. The ESO 514 is connected to output of the inverse static gain amplifier 508 and the non-linear model 512. The ESO 514 receives the process variable, u(t), and the output signal, y(t), and generates the first negative feedback signal, $z_1(t)$, and the second negative feedback signal, $z_3(t)$.

In an aspect of the present disclosure, the ESO 514 estimates a generalized disturbance which may include one or more of external disturbances (that is, the input disturbance, d), unknown internal dynamics of the ESO based FOC system 500, and uncertainty in the gain of the ESO based FOC system 500. Such generalized disturbances, i.e., the first negative feedback signal, $z_1(t)$, and the second negative feedback signal, $z_3(t)$, are input to the first multiplier 502 and the second multiplier 506, respectively, to cancel the generalized disturbance.

In an aspect of the present disclosure, the fractional order controller 504 includes a proportional-integral-derivative (PID) controller to generate an integer derivative. The fractional order controller 504 further includes a fractional order filter (FOF) operatively connected to the PID controller. The FOF generates a fractional order derivative from the integer derivative. The fractional order controller 504 further comprises an integer order filter and a computing circuitry including a memory and at least one processor. The processor includes program instructions to cascade the fractional order derivative with the integer order filter to generate the set point modified signal, $u_0(t)$.

Simulation Results on the Non-linear Model

The outputs of the non-linear model (414, 512) shown in FIG. 4 and FIG. 5 are given by:

$$\dddot{y}(t) = u(t) + d^3 y(t) + y(t) + d(t) \qquad (23)$$

where, u(t) is the process variable or an input to the non-linear model, y(t) is the output signal, and d(t) is the external disturbance.

To apply the LADRC scheme, equation (23) is rewritten as:

$$\dddot{y}(t) = b_0 u(t) + f(t) \qquad (24)$$

where, the, f(t), is the summation of the plant dynamics, $d^3y(t)+y(t)$, and the external disturbance, d(t).

To use the control system as described with reference to FIG. 4 and FIG. 5, a third order ESO is used to estimate the generalized disturbance f(t) with $b_0=1$, $\omega_0=20$ rad/s and L=[150 7500 125000]. Using equation (4), the nonlinear model (23) is approximately transformed to:

$$\ddot{y}(t) \approx u_0(t) \quad (25)$$

Figure 6:
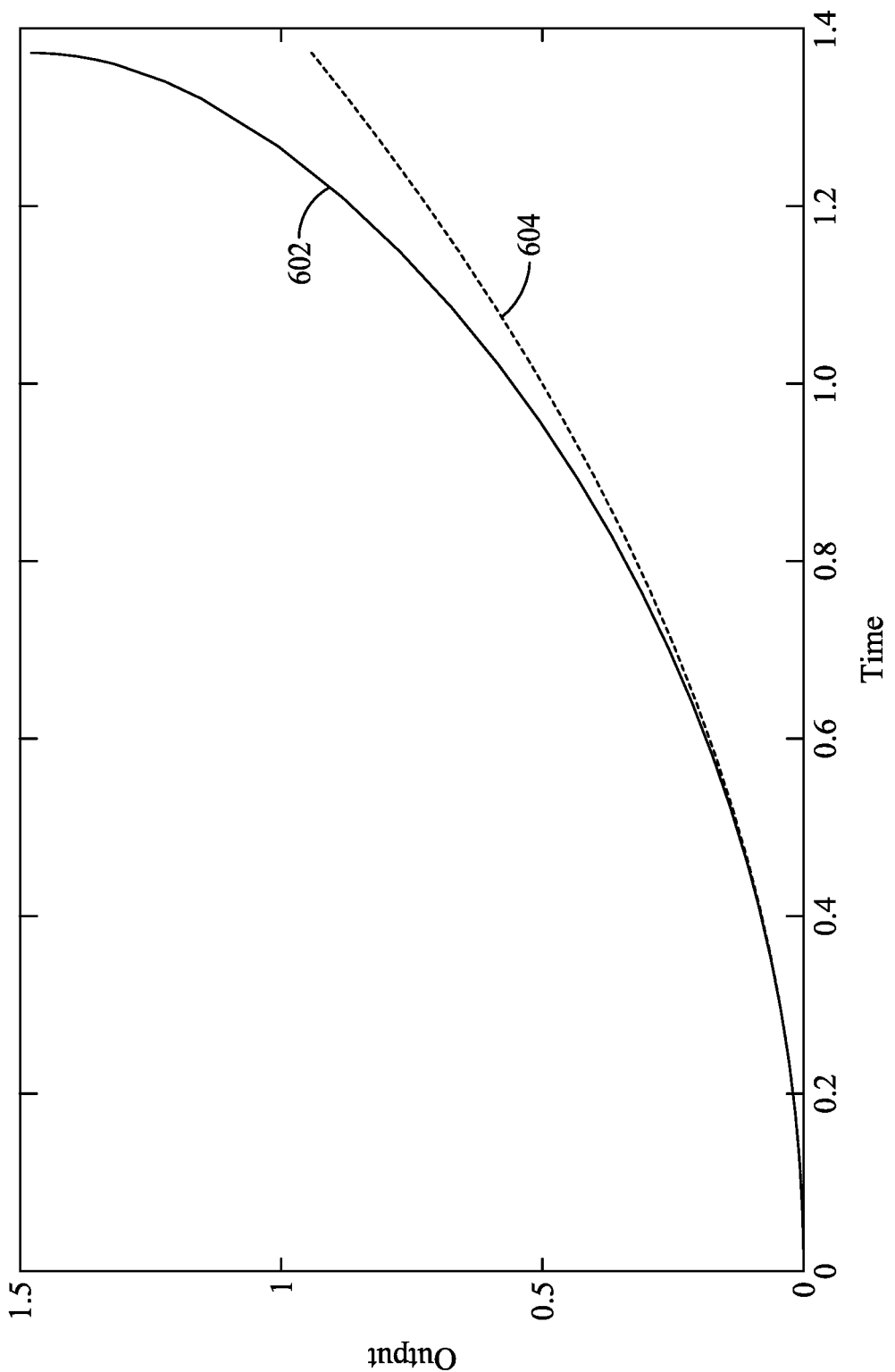
FIG. 6 is a graph depicting an output of the non-linear model, according to certain embodiments.

FIG. 6 shows two curves 602 and 604 depicting the output of the non-linear model given by equation (23) controlled by the control signal u(t) given by equation (4), where $z_{n+1}(t)$ is the approximation of the generalized disturbance, and equation (25), respectively. As shown in FIG. 6, the two outputs are different. However, with a well-tuned feedback controller, the system output can track the reference signal (or the input signal), r(t).

For the integer case, the feedback controller is designed such that transient response of the closed-loop system has characteristics of the following reference model:

$$G_{ref}(s) = \frac{\omega_c^2}{s^2 + 2z\omega_c s + \omega_c^2} \quad (26)$$

with z=0.7 and $\omega_c$=2.5 rad/s. In this case, a proportional-derivative (PD) controller of the form $$u_0(t)=K_p(r(t)-z_1(t))-K_d z_2(t) \quad (27)$$

with $K_p$=6.25 and $K_d$=3.5, is sufficient to fulfill this objective. $z_1$ and $z_2$ are the estimations of the output signal and its derivative, respectively.

To obtain approximately the same performance, with the aim of comparing the two proposed methods, i.e., the conventional LADRC system 400 and the ESO based FOC system 500 for the non-linear model, the fractional order controller 504 is designed to obtain, in closed-loop, the behavior of the reference model of equation (10), where $\tau_c$=0.5 and $\lambda$=0.3. From equation (22), given that n=2, the fractional order controller 504 is given by:

$$C(s) = \frac{1}{\tau_c} s^{1-\lambda} \quad (28)$$

to which corresponds the control law:

$$u_0(t)=K_c s^{1-\lambda}(r(t)-z_1(t)) \quad (29)$$

with $K_c=1/\tau_c=2$.

The conventional LADRC system 400 and the ESO based FOC system 500 were tested for the generalized disturbances f(t) which are unknown. The simulations of the conventional LADRC system 400 and the ESO based FOC system 500 are shown in FIG. 4 and FIG. 5, respectively, where r is a unit step applied at t=0 and d is a pulse disturbance with amplitude 20 applied at t=5s for 0.5s. All time-responses involving fractional derivative are obtained with simulation making use of Oustaloup's approximation in the frequency range $[10^{-4}\ 10^{+3}]$ with 10 cells.

The Oustaloup's approximation is used in approximating fractional order control systems. The Oustaloup's approximation method is based on a recursive distribution of poles and zeros, and approximates the basic fractional order operator $s^\alpha$ (0<α<1) to an integer order rational form within a chosen frequency band. A frequency band, $(\omega_l, \omega_h)$, is assumed as the desired frequency band. Within the desired frequency band, both gain and phase have ripples, which decreases as the order of approximation increases. The Oustaloup's approximation method is given by:

$$s^\alpha = K \sum_{k=-N}^{N} \frac{s + \omega_k'}{s - \omega_k} \quad (D)$$

where N=Order of approximation, $$K = \text{Gain} = \omega_h^\alpha \quad (E)$$

$$\omega_k' = \text{Zeros} = \omega_l \left(\frac{\omega_h}{\omega_l}\right)^{\frac{k+N+\frac{1}{2}(1-\alpha)}{2N+1}} \quad (F)$$

$$\omega_k = \text{Poles} = \omega_l \left(\frac{\omega_h}{\omega_l}\right)^{\frac{k+N+\frac{1}{2}(1-\alpha)}{2N+1}} \quad (G)$$

Figure 7:
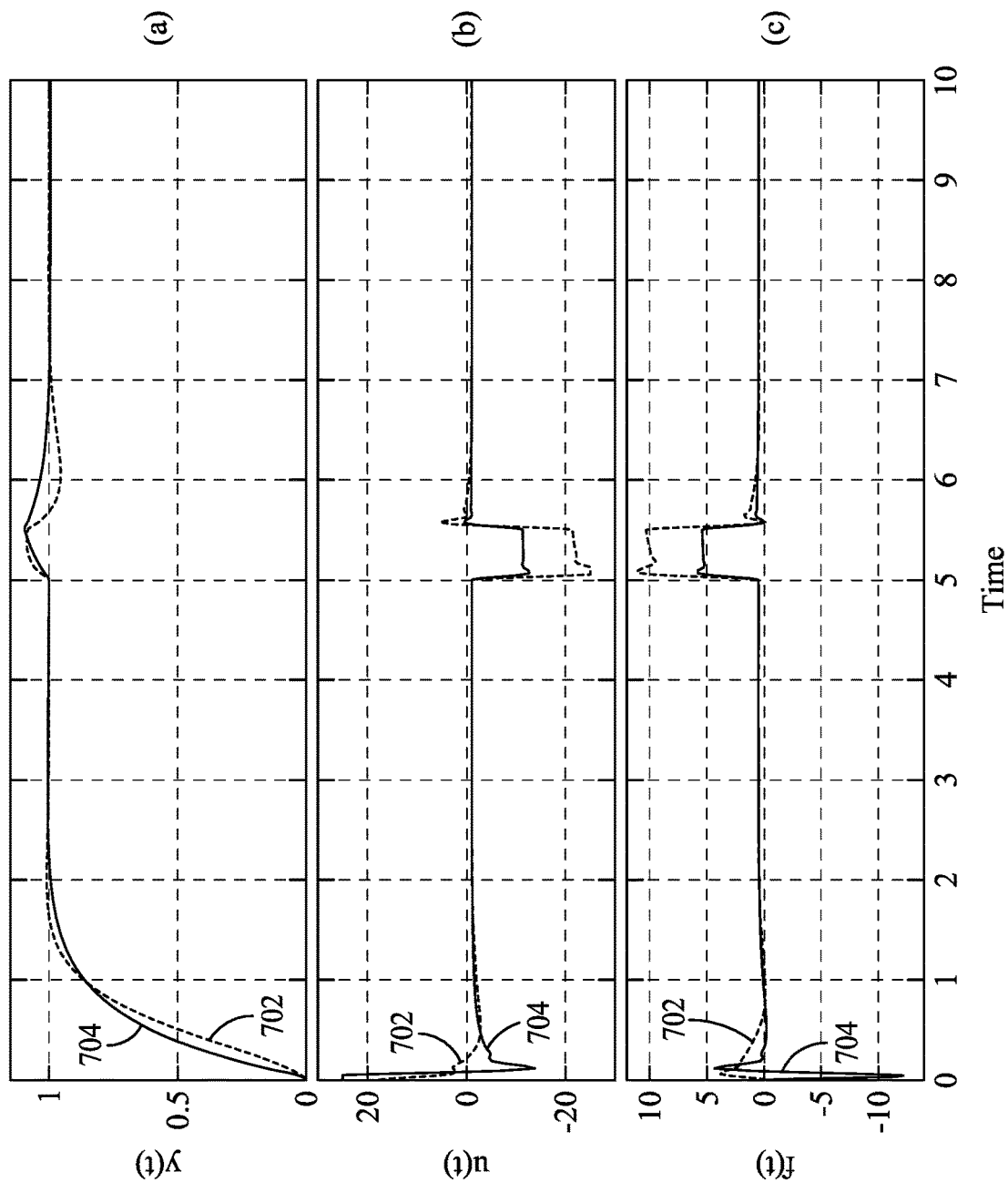
FIG. 7 shows graphs of performance of the conventional LADRC system and the ESO based FOC system in terms of (a) output signal, $y(t)$, (b) process variable or an input, $u(t)$, to the non-linear model, and (c) generalized disturbance, $f(t)$, according to certain embodiments.

FIG. 7 illustrates a comparison of the performance of the conventional LADRC system 400 and the ESO based FOC system 500. FIG. 7 shows two curves 702 and 704 depicting the performance of the conventional LADRC system 400 and the ESO based FOC system 500, respectively. FIG. 7 shows three graphs, graph (a) depicting the performance in terms of the output signal, y(t), graph (b) depicting the performance in terms of the process variable or an input, u(t), to the non-linear model, and graph (c) depicting the performance in terms of the generalized disturbance, f(t).

As shown in FIG. 7, set point tracking is achieved and the generalized disturbance, f(t), is well estimated and rejected by both controllers, i.e., the conventional LADRC system 400 and the ESO based FOC system 500. However, as shown in graph (c), the effect of the disturbance on the output is greater in the conventional LADRC system 400.

Figure 8:
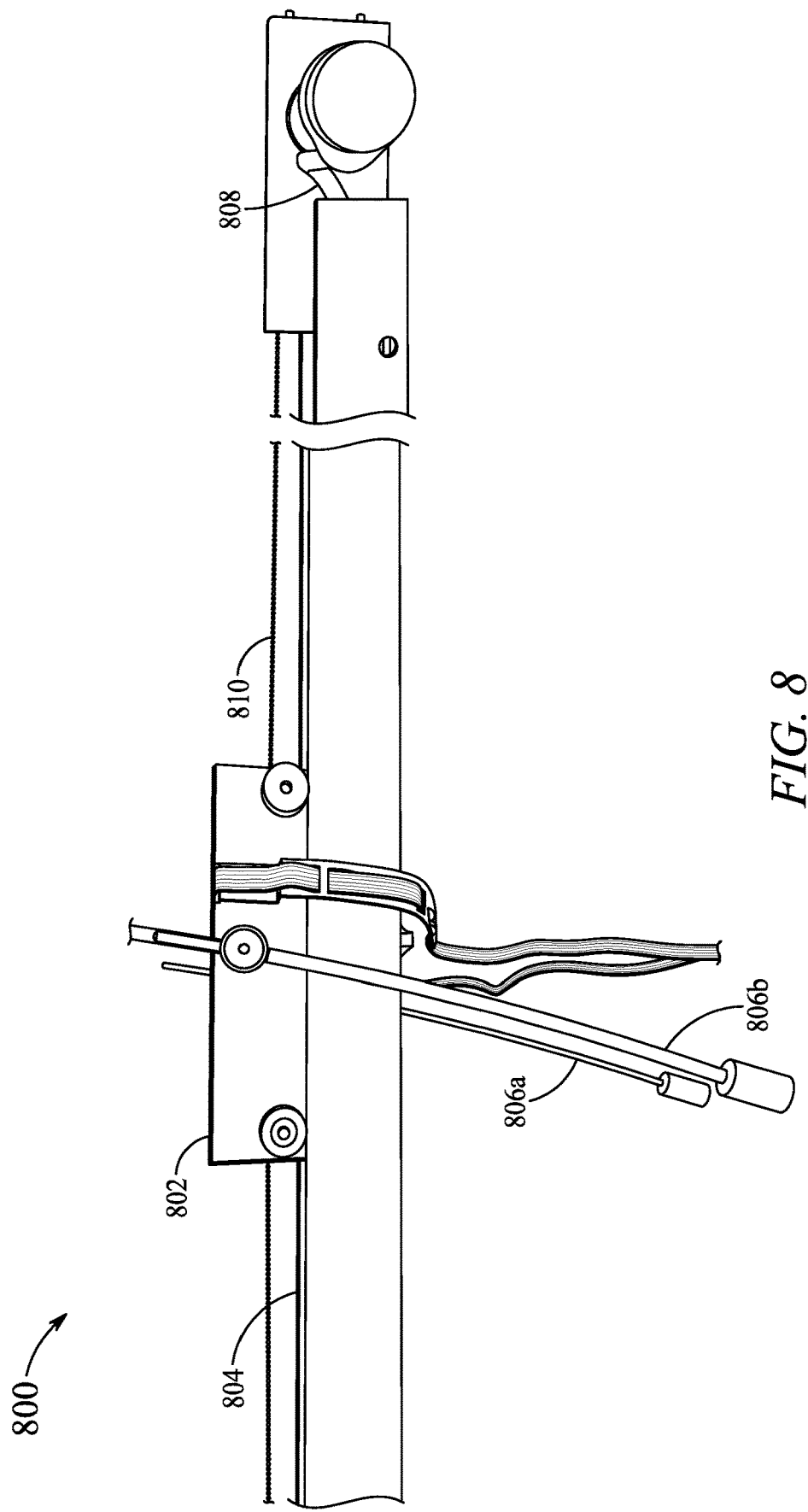
FIG. 8 is a schematic diagram of a cart-pendulum system, according to certain embodiments.

Experimental Results Applied to a Cart-Pendulum System:

FIG. 8 illustrates an experimental setup of a cart-pendulum system 800 representing the non-linear model (414 or 512) to which the ESO based FOC system 500 and the conventional LADRC system 400 are applied.

The cart-pendulum system involves movement of two interacting systems and its modeling is relatively complex, thus, making it a suitable example to compare performance of the ESO based FOC system 500 with the conventional LADRC system 400. The objective of the cart-pendulum system is to control position of the cart, as the pendulum swing is considered to be an internal and permanent disturbance. The experimental setup of the cart-pendulum system 800 comprises a cart 802, a track 804, a first pendulum 806a and a second pendulum 806b, a DC motor 808, and a belt 810.

The cart 802 moves along a 0.8 m length of the track 804. The cart 802 has a shaft on which two pendulums, the first pendulum 806a and the second pendulum 806b are mounted and can swing freely. The cart 802 moves along the track 804 causing the two *pendula* 806 to swing. Inversely, the swing of the two *pendula* 806 disrupts the movement of the cart 802. The DC motor 808, fixed to the end of the track 804, allows the cart 802 to move by pulling the belt 810 in both, right and left directions. The voltage applied to the DC motor 808 is a control signal and position of the cart 802 on the track 804 is a controlled variable. Angle of the pendulums 806 and the position of the cart 802 are measured by optical encoders having a resolution of 1024 lines per revolution. In an aspect of the present disclosure, a first optical encoder measures the position of the cart 802, a second optical encoder measures the angle of the first pendulum 806a, and a third optical encoder measures the angle of the second pendulum 806b.

In an aspect of the present disclosure, the experimental setup of the cart-pendulum system 800 is interfaced with an Advantech PCI-1711 card (a Multifunction Peripheral Component Interconnect card) and output feedback controller is implemented in a MATLAB/Simulink environment, with a sampling time of 0.001s.

To show the effectiveness of the ESO based FOC system 500, its performance is evaluated and compared to that of the conventional LADRC system 400. The design parameters of the conventional LADRC system 400 and the ESO based FOC system 500 are as follows:

For the conventional LADRC system 400, the cart-pendulum system 800 is modeled by the model of equation (1), where n=2. The gain is approximated by $b_0$=10. To estimate the generalized disturbance and the derivative of the output, a $3^{rd}$ order integer ESO is used. The observer bandwidth is $\omega_0$=100 rad/s and the observer gain is L=[150 7500 125.10³]. A set point tracking controller is designed based on the closed-loop reference model given by equation (26) with $\omega_c$=2.5 rad/s and z=0.9. The control law is given by:

$$u(t) = \frac{1}{b_0}[K_p(r(t) - z_1(t)) - K_d z_2(t) - z_3(t)] \quad (30)$$

A closed-loop transfer function obtained with control law of equation (30), assuming that the observer is well dimensioned (i.e., $z_1$=y, $z_2$=ẏ) and $z_3$=f, is:

$$\frac{y(s)}{r(s)} = \frac{K_p}{s^2 + K_d s + K_p} \quad (31)$$

A term-to-term identification with the reference model given by equation (26) enables the parameters $K_p$ and $K_d$ to be calculated, which results in:

$$K_p = \omega_n^2 \text{ and } K_d = 2z\omega_n \quad (32)$$

For $\omega_c$=2.5 rad/s and z=0.9, the numerical values are $K_p$=6.25 and $K_d$=4.5.

Similarly, the ESO based FOC system 500 is based on the closed-loop weighted Bode's ideal transfer function given by equation (19), where n=2, $\tau_c$=0.5s and $\lambda$=0.3. The observer used to estimate f(t) is same as that used in the conventional LADRC system 400. The control law is given by:

$$u(t) = \frac{1}{b_0}[K_c D^{1-\lambda}(r(t) - z_1(t)) - z_3(t)] \quad (33)$$

where, $D^{1-\lambda}(\cdot)$ is the fractional order differentiator, $K_c$=2, $z_1(t)$ is the estimation of y(t), and $z_3(t)$ is the estimation of f(t). A CRONE approximation is used to implement the fractional order operator in the frequency range [$10^{-4}$ $10^{+2}$] with 10 cells.

Figure 9:
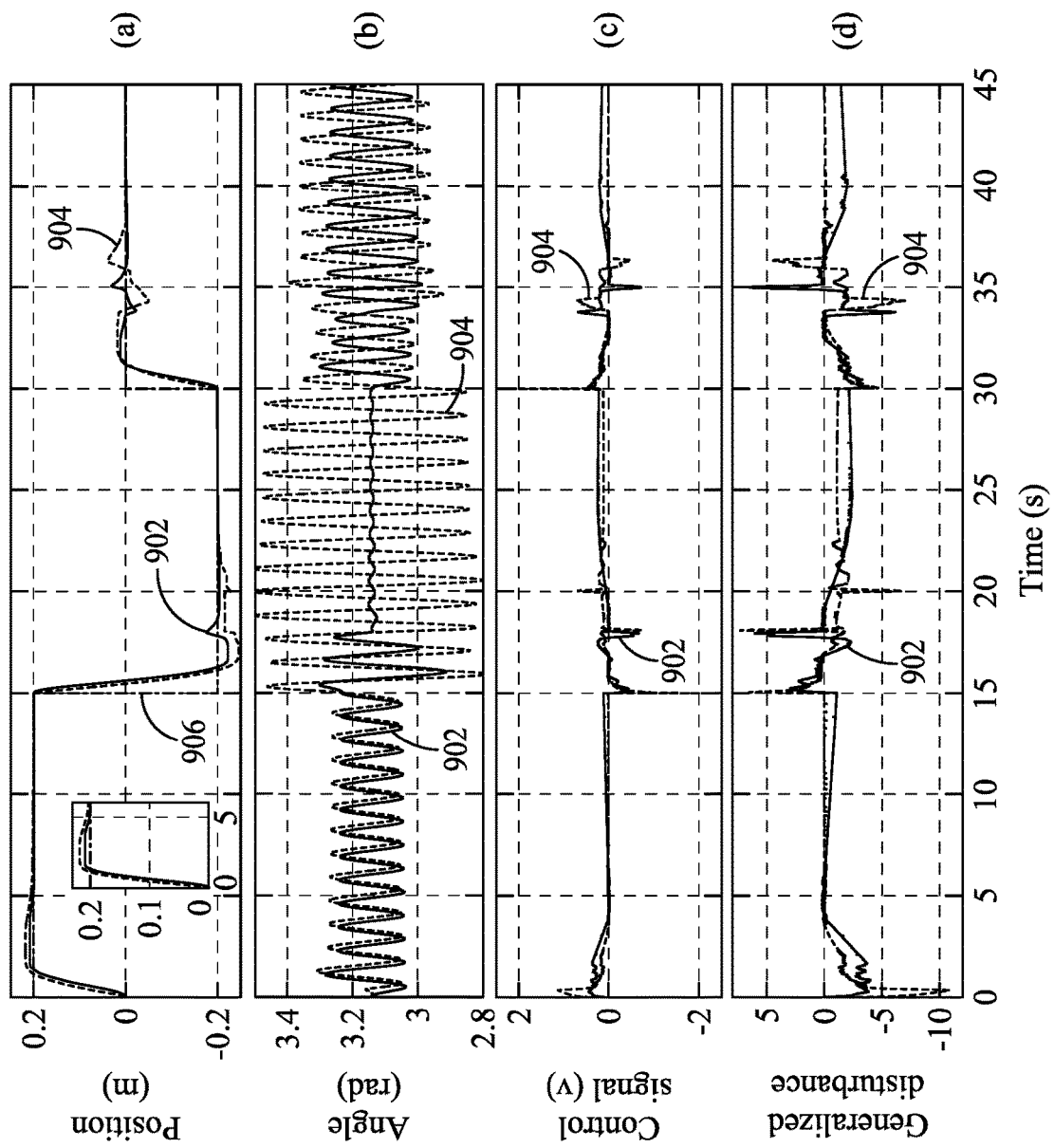
FIG. 9 shows graphs of experimental results for a square reference signal for (a) position of cart versus time, (b) angle of pendulums versus time, (c) control signal versus time, and (d) generalized disturbance versus time, according to certain embodiments.

Table 1 summarizes a comparison of the performance analysis of the conventional LADRC system 400 and the ESO based FOC system 500, which summarizes the performance shown in FIG. 9. For the square signal, the reference positions are as follows. Step 1: +0.2 m at t=0 s, Step 2: −0.2 m at t=15 s, and Step 3: 0 m at t=30 s. The parameters listed in Table 1 are: Mp (%), which is the overshoot, Umax, which is the maximum amplitude of the control signal deviation, and Δθ, which is the maximum variation of the pendulum angle.

TABLE 1

Performance analysis of the two control systems

| | Step 1 | | | Step 2 | | | Step 3 | | |
|---|---|---|---|---|---|---|---|---|---|
| | $M_p$(%) | $U_{max}$ | Δθ | $M_p$(%) | $U_{max}$ | Δθ | $M_p$(%) | $U_{max}$ | Δθ |
| Conventional LADRC System 400 | 4.0 | 0.42 | 0.14 | 11 | 0.44 | 0.16 | 1.14 | 0.44 | 0.16 |
| ESO based FOC system 500 | 8.5 | 1.12 | 0.17 | 20 | 2.5 | 0.35 | 1.71 | 2.5 | 0.21 |

Experimental Results

To compare the two control systems, the conventional LADRC system 400 and the ESO based FOC system 500, two experiments were carried out using the cart-pendulum system 800. The first experiment was carried out using a square reference signal and the second experiment was carried out using a sinusoidal reference signal.

FIG. 9 illustrates experimental results for the square reference signal, according to exemplary aspects of the present disclosure. For the square reference signal, the reference positions are: +0.2 m at t=0 s, −0.2 m at t=15 s, and 0 at t=30 s. In addition, several external disturbances are applied on the cart 802 at t=16 s, t=20 s, t=32 s, and t=36 s by manually tapping the cart.

FIG. 9 shows the experimental results obtained for the conventional LADRC system 400 depicted by curve 902 and the ESO based FOC system 500 depicted by curve 904. FIG. 9 shows four plots, plot (a) position of the cart 802 vs. time, plot (b) angle of the pendulums 806 vs. time, plot (c) control signal vs. time, and plot (d) generalized disturbance vs. time. FIG. 9 shows that, with the generalized disturbance, the cart 802 tracks the desired position (depicted by curve 906) with a small overshoot for both the control systems, i.e., the conventional LADRC system 400 and the ESO based FOC system 500. The internal and the external disturbance are well estimated and compensated by both the control systems. The generalized disturbance is also well estimated and rejected by the two control systems. As shown in FIG. 9, the control signal is more important for the ESO based FOC system 500, particularly when the set point signal changes. This is explained by the derivative operator of the fractional order controller of the ESO based FOC system 500 and by the fact that the transient response, obtained by the ESO based FOC system 500, is slightly faster.

Figure 10:
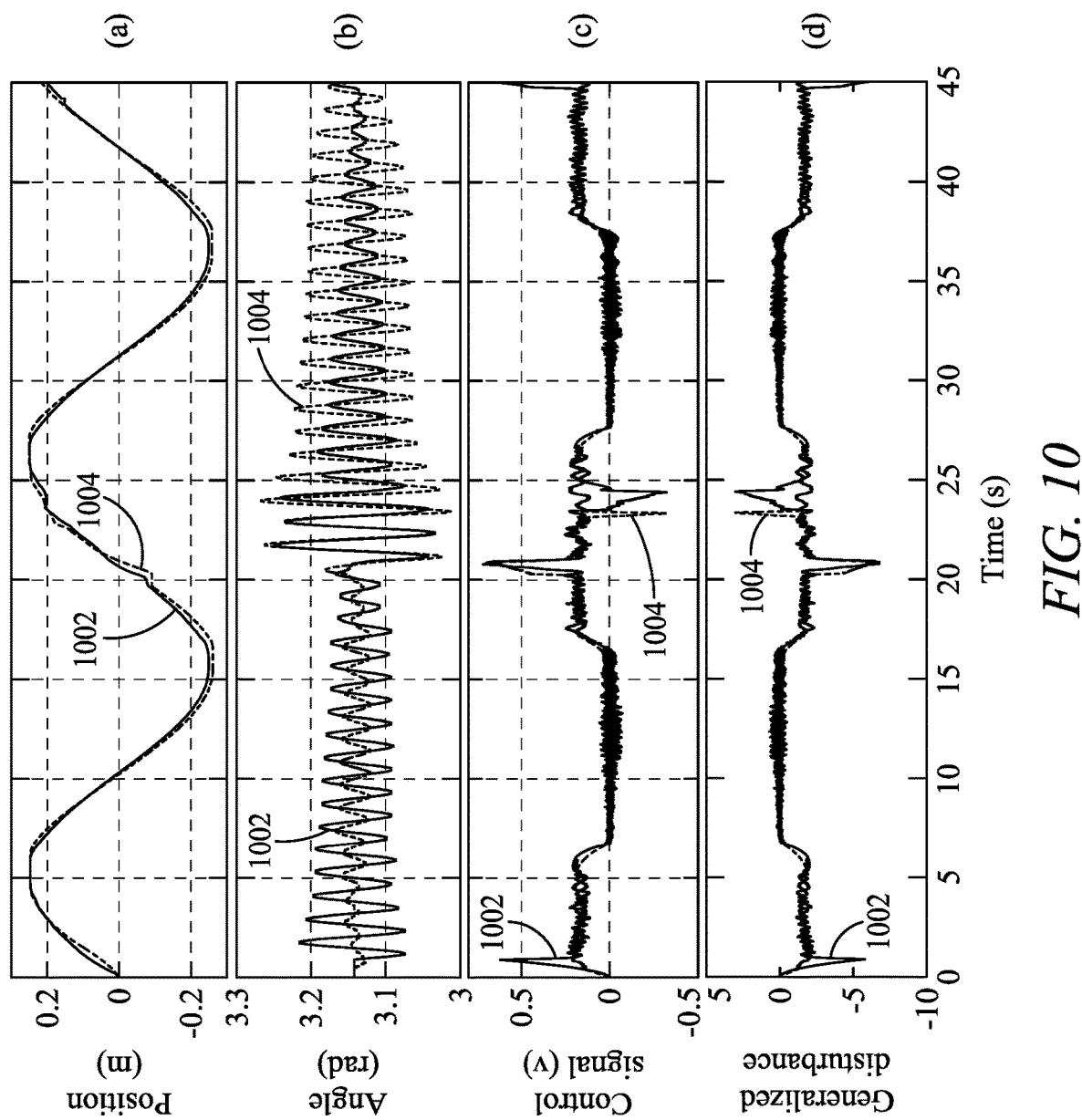
FIG. 10 shows graphs of experimental results for a sinusoidal reference signal for (a) position of the cart versus time, (b) angles of the *pendula* versus time, (c) control signal versus time, and (d) generalized disturbance versus time, according to certain embodiments.

FIG. 10 illustrates experimental results for the sinusoidal reference signal, according to exemplary aspects of the present disclosure. The sinusoidal reference signal consists of a continuous change of position in the form of a sine waver(t)=0.25 sin(0.3t). External disturbances are applied on the cart 802 at t=20 s and t=23 s.

In FIG. 10, the experimental results obtained for the conventional LADRC system 400 are depicted by curve 1002 and the ESO based FOC system 500 is depicted by curve 1004. FIG. 10 shows four plots, plot (a) position of the cart 802 vs. time, plot (b) angle of the pendulums 806 vs. time, plot (c) control signal vs. time, and plot (d) generalized disturbance vs. time. FIG. 10 shows that both the control systems, i.e., the conventional LADRC system 400 and the ESO based FOC system 500 correctly estimates and rejects the disturbances. Further, as shown in FIG. 10, the control signals are approximately same for both the control systems.

Figure 11:
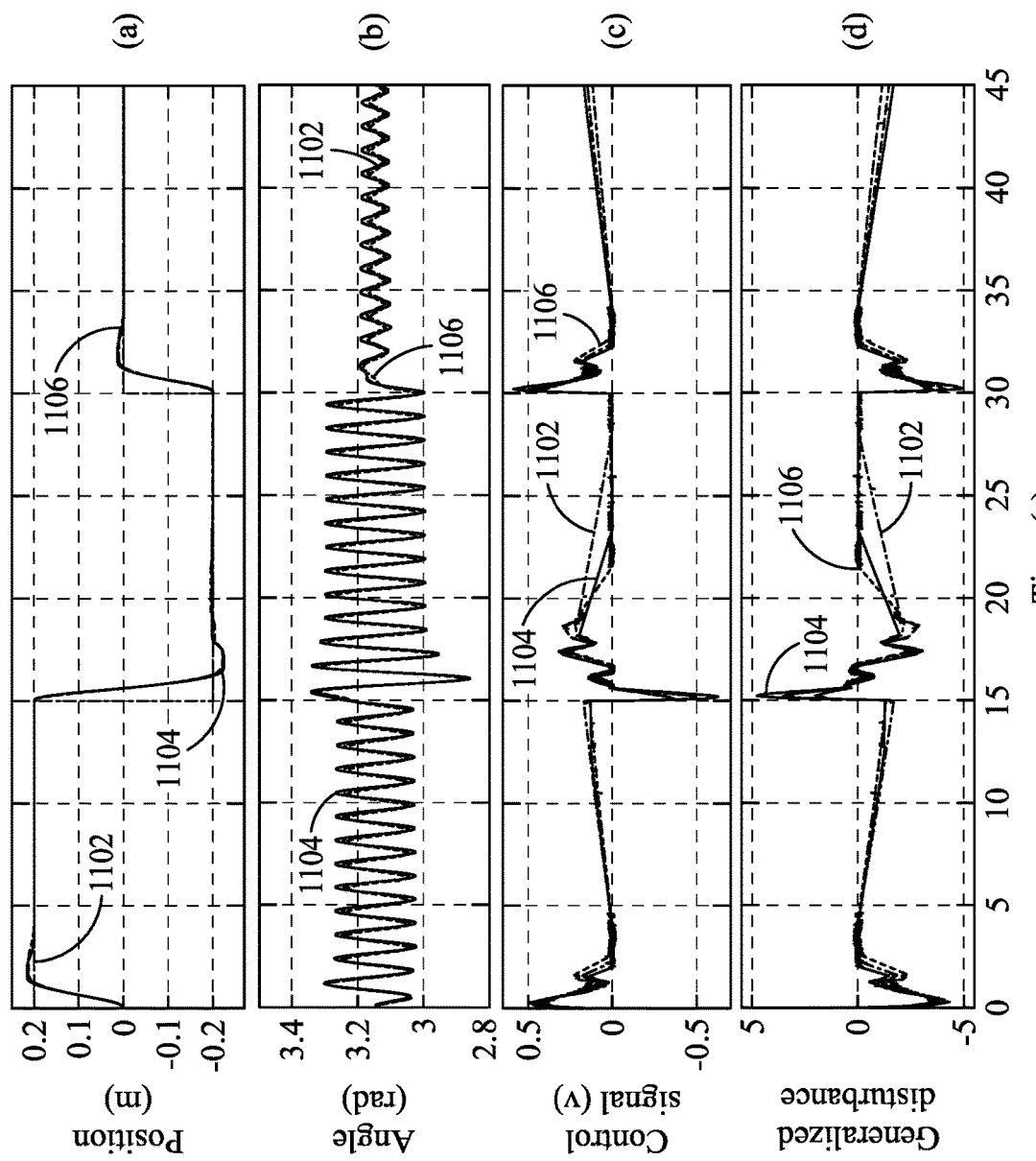
FIG. 11 shows graphs of the conventional LADRC system for cart weight variation for (a) position of the cart versus time, (b) angles of the *pendula* versus time, (c) control signal versus time, and (d) generalized disturbance versus time, according to certain embodiments.
Figure 12:
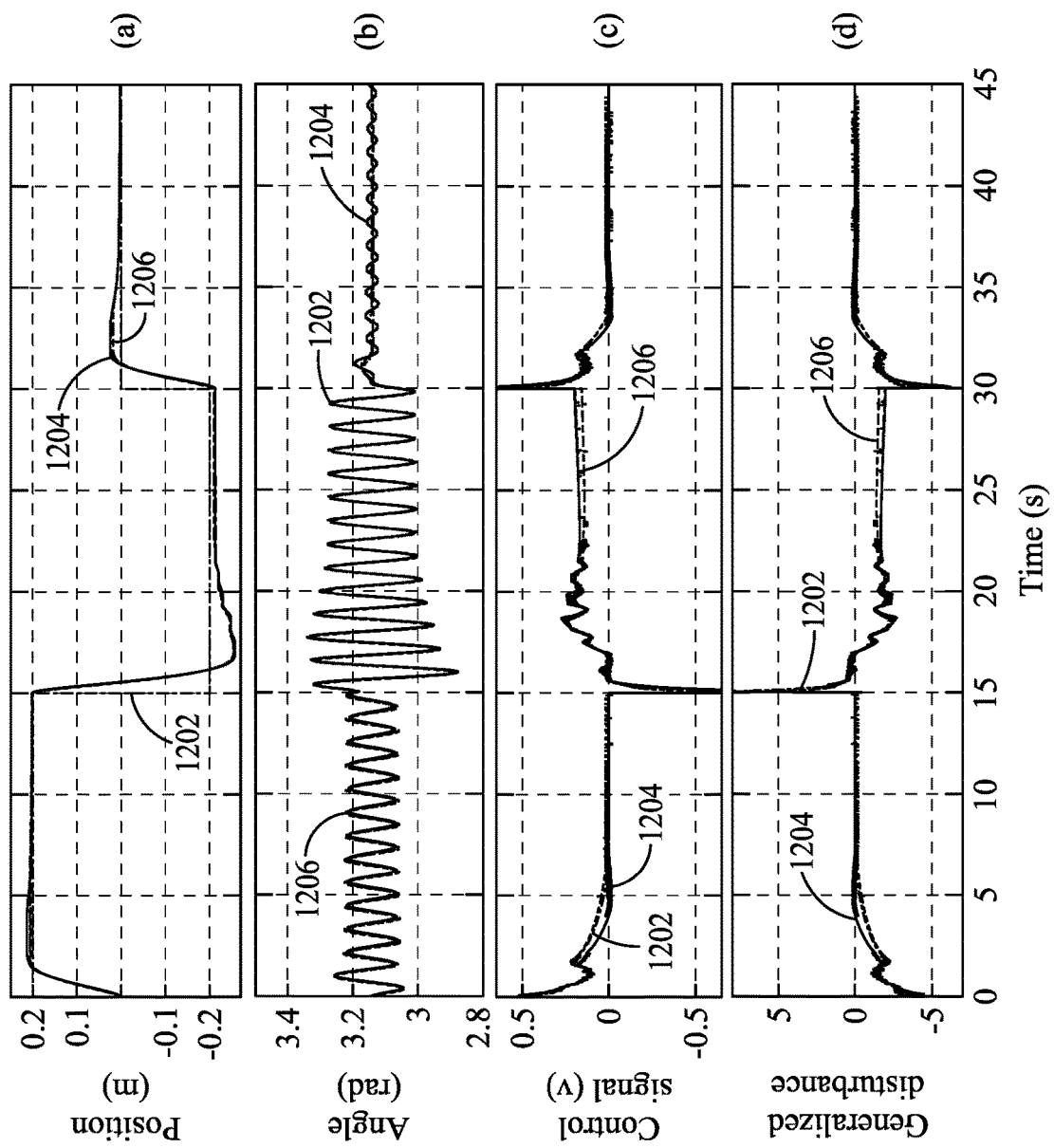
FIG. 12 shows graphs of the ESO based FOC system for cart weight variation for (a) position of the cart versus time, (b) angles of the *pendula* versus time, (c) control signal versus time, and (d) generalized disturbance versus time, according to certain embodiments.

FIGS. 11 and 12 illustrate robustness of the conventional LADRC system 400 and the ESO based FOC system 500, respectively, against weight variation of the cart 802, according to exemplary aspects of the present disclosure. To show the robustness of the two control systems, the conventional LADRC system 400 and the ESO based FOC system 500 are evaluated for three values of the weight of the cart 802, a normal value 2.3 kg and the value modified by adding on the cart 802 an additional metal mass weighing 0.5 kg and 1 kg. The three weight values are 2.3, (2.3+0.5), and (2.3+1). The corresponding curves are curve 1106 for the normal weight 2.3, curve 1102 for the (2.3+0.5) weight, and curve 1104 for the (2.3+1) weight. The obtained results are illustrated in FIG. 11 for the conventional LADRC system 400 and in FIG. 12 for the ESO based FOC system 500. FIGS. 11 and 12 each show four plots, in which plot (a) represents the position of the cart 802 vs. time, plot (b) is the angle of the *pendula* 806 vs. time, plot (c) is the control signal vs. time, and plot (d) is the generalized disturbance vs. time.

As shown in FIGS. 11 and 12, for the two control systems, the change of the weight of the cart 802 has no effect on changes in the position of the cart 802. This is because LADRC is a model-free control system which is not based on the controlled system parameters. Further, elimination of the over time illustrates that the LADRC control system converges. The effect of the is different when the weight of the cart 802 is normal and when the weight of the cart 802 is modified. This difference is due to influence of the weight of the cart 802 on its position. This is estimated by the ESO and then canceled by the control law, which therefore evolves accordingly as shown in FIGS. 11 and 12.

According to aspects of the present disclosure, the control system based on the extended state observer (ESO) associated with the fractional order controller shows superior performance in comparison to the existing state of the art techniques. The analytical method to design the fractional order controller is based on the Bode's ideal transfer function. The control system disclosed according to aspects of the present disclosure represents a simple design technique that meets robustness objectives represented by the weighted Bode's ideal transfer function. One of the primary characteristic of the disclosed control system is enhancement of a closed-loop reference model by including robustness and dynamic performances.

Figure 13:
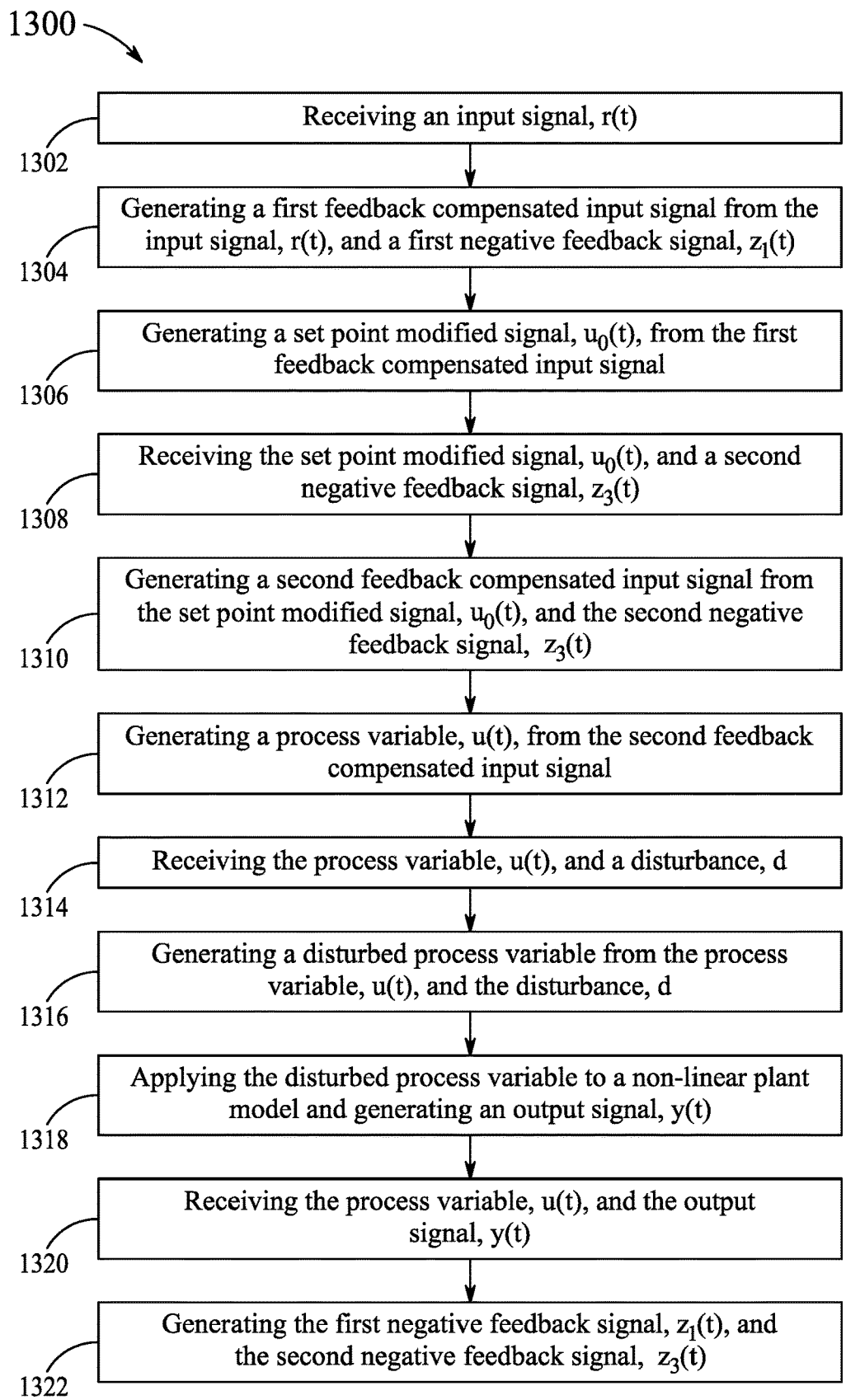
FIG. 13 is an exemplary flowchart of a method illustrating set point tracking control of an $n^{th}$ order integer plant, according to certain embodiments.

FIG. 13 shows an exemplary flowchart 1300 of the present invention illustrating a set point tracking control method for the ESO based FOC system of FIG. 5, according to exemplary aspects of the present disclosure.

At step 1302, the method includes receiving an input signal, r(t).

At step 1304, the method includes generating a first feedback compensated input signal from the input signal, r(t), and a first negative feedback signal, $z_1(t)$.

At step 1306, the method includes generating a set point modified signal, $u_0(t)$ from the first feedback compensated input signal. The fractional order controller 504 generates the set point modified signal, $u_0(t)$.

At step 1308, the method includes receiving the set point modified signal, $u_0(t)$, and a second negative feedback signal, $z_3(t)$.

At step 1310, the method includes generating a second feedback compensated input signal from the set point modified signal, $u_0(t)$, and the second negative feedback signal, $z_3(t)$.

At step 1312, the method includes generating a process variable, u(t) from the second feedback compensated input signal. The inverse static gain amplifier 508 applies the gain, $b_0^{-1}$, to the second feedback compensated input signal to generate the process variable, u(t).

At step 1314, the method includes receiving the process variable, u(t), and a disturbance, d.

At step 1316, the method includes generating a disturbed process variable from the process variable, u(t), and the disturbance, d.

At step 1318, the method includes applying the disturbed process variable to a non-linear plant model and generating an output signal, y(t). The disturbed process variable is applied to the non-linear model 512 to generate the output signal, y(t).

At step 1320, the method includes receiving the process variable, u(t), and the output signal, y(t). The ESO 514 receives the process variable, u(t), and the output signal, y(t).

At step 1322, the method includes generating the first negative feedback signal, $z_1(t)$, and the second negative feedback signal, $z_3(t)$. In an aspect of the present disclosure, the ESO 514 estimates a generalized disturbance which may include one or more of external disturbances (that is, the input disturbance, d), unknown internal dynamics of the ESO based FOC system 500, and uncertainty in the gain of the ESO based FOC system 500. Such generalized disturbances, i.e., the first negative feedback signal, $z_1(t)$, and the second negative feedback signal, $z_3(t)$, are used to cancel the.

The first embodiment is illustrated with respect to FIGS. 1-13. The first embodiment describes set point tracking system for an nth order integer plant. The set point tracking system comprising a set point tracking loop. The set point tracking loop including a first multiplier configured to receive an input signal, r(t), and a first negative feedback signal, $z_1(t)$, and generate a first feedback compensated input signal; a fractional order controller connected to the first multiplier to receive the first feedback compensated input signal and generate a set point modified signal, $u_0(t)$; a second multiplier configured to receive the set point modified signal, $u_0(t)$, and a second negative feedback signal, $z_3(t)$, and generate a second feedback compensated input signal; an inverse static gain amplifier, $b_0^{-1}$, configured to receive the second feedback compensated input signal and generate a process variable, u(t); a third multiplier configured to receive the process variable, u(t), and a disturbance, d, and generate a disturbed process variable; a non-linear plant model configured to receive the disturbed process variable and generate an output signal, y(t); and an extended state observer configured to receive the process variable, u(t), and the output signal, y(t), and generate the first negative feedback signal, $z_1(t)$, and the second negative feedback signal, $z_3(t)$.

The fractional order controller of the set point tracking system includes a proportional integral derivative, PID, controller configured to generate an integer derivative; a fractional order filter, FOF, operatively connected to the PID controller, the FOF configured to generate a fractional order derivative from the integer derivative; an integer order filter; and a computing circuitry including a memory and at least one processor, the processor having program instructions configured to cascade the fractional order derivative with the integer order filter to generate the set point modified signal, $u_0(t)$.

A transfer function, C(s), of the fractional order controller is given by:

$$C(s) = \frac{s^{n-2}}{(1+Ts)^{n-2}} \frac{1}{\tau_c} s^{1-\lambda}$$

where T is a time constant of the integer order filter of the fractional order controller, $\tau_c$ is a time constant of the set point tracking loop given by $$\tau_c = \frac{1}{\omega_c^{\lambda+1}},$$

$\omega_c$ is a center frequency of the fractional order controller, s is a Laplace transform of the output signal y(t), $\lambda$ is a non-integer order of the set point tracking system, wherein $$\lambda = \frac{\pi - \varphi_m}{\pi/2} - 1,$$

and $\varphi_m$ is a phase margin of an open loop formed by the fractional order controller, the inverse static gain amplifier and the non-linear plant model.

The fractional order controller is configured to determine the non-integer order, $\lambda$, by imposing a closed loop step response which has an iso-damping property.

The fractional order controller is configured to impose the iso-damping property by applying Bode's ideal transfer function as a reference model to a closed loop formed by the fractional order controller, the inverse static gain amplifier, the non-linear plant model, and the extended state observer, wherein Bode's ideal transfer function, $G_{cl}(s)$, is given by:

$$G_{cl}(s) = \frac{1}{1 + \tau_c s^{\lambda+1}(1+Ts)^{n-2}}.$$

The set point tracking system, wherein the non-linear plant model comprises a cart; a track configured to confine the cart to linear movement; a first pendulum and a second pendulum connected to the cart, the first pendulum and the second pendulum configured to generate the disturbance, d, in the linear movement by swinging when the cart is moved; a DC motor; a belt connected to the DC motor and the cart; a first optical encoder configured to measure a position of the cart; a second optical encoder configured to measure a first angle of the first pendulum; a third optical encoder configured to measure a second angle of the second pendulum; and wherein the fractional order controller is configured to generate control signals for the DC motor, wherein the control signals are configured to move the cart along the track with minimum disturbance.

The set point tracking system, wherein the fractional order controller is configured to generate the control signals by applying a transfer function, C(s), of the fractional order controller to an input motor signal, wherein the transfer function, C(s) is given by:

$$C(s) = \frac{s^{n-2}}{(1+Ts)^{n-2}} \frac{1}{\tau_c} s^{1-\lambda}$$

where T is a time constant of the integer order filter of the fractional order controller, $\tau_c$ is a time constant of the set point tracking loop given by $$\tau_c = \frac{1}{\omega_c^{\lambda+1}},$$

$\omega_c$ is a center frequency of the fractional order controller, s is a Laplace transform of the output signal y(t), $\lambda$ is a non-integer order of the set point tracking system, wherein $$\lambda = \frac{\pi - \varphi_m}{\pi/2} - 1,$$

and $\varphi_m$ is a phase margin of an open loop formed by the fractional order controller, the inverse static gain amplifier and the non-linear plant model.

The second embodiment is illustrated with respect to FIGS. 1-13. The second embodiment describes a method for set point tracking control of an nth order integer plant. The method comprising: receiving, by a first multiplier, an input signal, r(t); generating, by the first multiplier, a first feedback compensated input signal from the input signal, r(t), and a first negative feedback signal, $z_1(t)$; generating, by a fractional order controller, a set point modified signal, $u_0(t)$ from the first feedback compensated input signal; receiving, by a second multiplier, the set point modified signal, $u_0(t)$, and a second negative feedback signal, $z_3(t)$; generating, by the second multiplier, a second feedback compensated input signal from the set point modified signal, $u_0(t)$, and the second negative feedback signal, $z_3(t)$; generating, by an inverse static gain amplifier, $b_0^{-1}$, a process variable, u(t) from the second feedback compensated input signal; receiving, by a third multiplier, the process variable, u(t), and a disturbance, d; generating, by the third multiplier, a disturbed process variable from the process variable, u(t), and the disturbance, d; applying the disturbed process variable to a non-linear plant model and generating an output signal, y(t); receiving, by an extended state observer, the process variable, u(t), and the output signal, y(t); and generating, by the extended state observer, the first negative feedback signal, $z_1(t)$, and the second negative feedback signal, $z_3(t)$.

The method further comprising generating the set point modified signal, $u_0(t)$, by applying a transfer function, C(s), of the fractional order controller to the first feedback compensated input signal, wherein the transfer function, C(s), is given by:

$$C(s) = \frac{s^{n-2}}{(1+Ts)^{n-2}} \frac{1}{\tau_c} s^{1-\lambda}$$

where T is a time constant of an integer order filter of the fractional order controller, $\tau_c$ is a time constant of the set point tracking loop given by $$\tau_c = \frac{1}{\omega_c^{\lambda+1}},$$

$\omega_c$ is a center frequency of the fractional order controller, s is a Laplace transform of the output signal y(t), $\lambda$ is a non-integer order of a set point tracking system, wherein $$\lambda = \frac{\pi - \varphi_m}{\pi/2} - 1,$$

and $\varphi_m$ is a phase margin of an open loop formed by the fractional order controller, the inverse static gain amplifier and the non-linear plant model.

The method further comprising generating, by a proportional integral derivative, PID, controller, an integer derivative; generating, by a fractional order filter, FOF, a fractional order derivative from the integer derivative; and cascading the fractional order derivative with an integer order filter to generate the set point modified signal, $u_0(t)$.

The method further comprising determining the non-integer order, $\lambda$, by imposing a closed loop step response which has an iso-damping property.

The method further comprising imposing the iso-damping property by applying Bode's ideal transfer function, $G_{cl}(s)$, as a reference model to a closed loop formed by the fractional order controller, the inverse static gain amplifier, the non-linear plant model, and the extended state observer, wherein Bode's ideal transfer function, $G_{cl}(s)$, is given by:

$$G_{cl}(s) = \frac{1}{1 + \tau_c s^{\lambda+1}(1+Ts)^{n-2}}.$$

The method further comprising generating, by the fractional order controller, control signals for a DC motor, wherein the control signals are configured to move a cart along a track; and compensating for the disturbance, d, generated by swinging pendulums attached to the cart.

The method further comprising generating the control signals by applying a transfer function, C(s), of the fractional order controller to an input motor signal, wherein transfer function, C(s) is given by:

$$C(s) = \frac{s^{n-2}}{(1+Ts)^{n-2}} \frac{1}{\tau_c} s^{1-\lambda}$$

where T is a time constant of an integer order filter of the fractional order controller, $\tau_c$ is a time constant of the set point tracking loop given by $$\tau_c = \frac{1}{\omega_c^{\lambda+1}},$$

$\omega_c$ is a center frequency of the fractional order controller, s is a Laplace transform of the output signal y(t), $\lambda$ is a non-integer order of the set point tracking system, wherein $$\lambda = \frac{\pi - \varphi_m}{\pi/2} - 1,$$

and $\varphi_m$ is a phase margin of an open loop formed by the fractional order controller, the inverse static gain amplifier and the non-linear plant model.

The third embodiment is illustrated with respect to FIGS. 1-13. The third embodiment describes a non-transitory computer readable medium having instructions stored therein that, when executed by one or more processors, cause the one or more processors to perform a method of: receiving, by a first multiplier, an input signal, r(t); generating, by the first multiplier, a first feedback compensated input signal from the input signal, r(t), and a first negative feedback signal, $z_1(t)$; generating, by a fractional order controller, a set point modified signal, $u_0(t)$ from the first feedback compensated input signal; receiving, by a second multiplier, the set point modified signal, $u_0(t)$, and a second negative feedback signal, $z_3(t)$; generating, by the second multiplier, a second feedback compensated input signal from the set point modified signal, $u_0(t)$, and the second negative feedback signal, $z_3(t)$; generating, by an inverse static gain amplifier, $b_0^{-1}$, a process variable, u(t) from the second feedback compensated input signal; receiving, by a third multiplier, the process variable, u(t), and a disturbance, d; generating, by the third multiplier, a disturbed process variable from the process variable, u(t), and the disturbance, d; applying the disturbed process variable to a non-linear plant model and generating an output signal, y(t); receiving, by an extended state observer, the process variable, u(t), and the output signal, y(t); and generating, by the extended state observer, the first negative feedback signal, $z_1(t)$, and the second negative feedback signal, $z_3(t)$.

The non-transitory computer readable medium method further comprising generating the set point modified signal, $u_0(t)$, by applying a transfer function, C(s), of the fractional order controller to the first feedback compensated input signal, wherein the transfer function, C(s), is given by:

$$C(s) = \frac{s^{n-2}}{(1+Ts)^{n-2}} \frac{1}{\tau_c} s^{1-\lambda}$$

where T is a time constant of an integer order filter of the fractional order controller, $\tau_c$ is a time constant of the set point tracking loop given by $$\tau_c = \frac{1}{\omega_c^{\lambda+1}},$$

$\omega_c$ is a center frequency of the fractional order controller, s is a Laplace transform of the output signal y(t), $\lambda$ is a non-integer order of a set point tracking system, wherein $$\lambda = \frac{\pi - \varphi_m}{\pi/2} - 1,$$

and $\varphi_m$ is a phase margin of an open loop formed by the fractional order controller, the inverse static gain amplifier and the non-linear plant model.

The non-transitory computer readable medium method further comprising generating, by a proportional integral derivative, PID, controller, an integer derivative; generating, by a fractional order filter, FOF, a fractional order derivative from the integer derivative; and cascading the fractional order derivative with an integer order filter to generate the set point modified signal, $u_0(t)$.

The non-transitory computer readable medium method further comprising determining the non-integer order, $\lambda$, by imposing a closed loop step response which has an iso-damping property, wherein imposing the iso-damping property includes applying Bode's ideal transfer function, $G_{cl}(s)$, as a reference model to a closed loop formed by the fractional order controller, the inverse static gain amplifier, the non-linear plant model and the extended state observer, wherein Bode's ideal transfer function, $G_{cl}(s)$, is given by:

$$G_{cl}(s) = \frac{1}{1 + \tau_c s^{\lambda+1}(1+Ts)^{n-2}}.$$

The non-transitory computer readable medium method further comprising generating, by the fractional order controller, control signals for a DC motor, wherein the control signals are configured to move a cart along a track; and compensating for the disturbance, d, generated by swinging pendulums attached to the cart.

The non-transitory computer readable medium method further comprising generating the control signals by applying a transfer function, $C(s)$, of the fractional order controller to an input motor signal, wherein the transfer function, $C(s)$ is given by:

$$C(s) = \frac{s^{n-2}}{(1+Ts)^{n-2}} \frac{1}{\tau_c} s^{1-\lambda}$$

where T is a time constant of an integer order filter of the fractional order controller, $\tau_c$ is a time constant of the set point tracking loop given by $$\tau_c = \frac{1}{\omega_c^{\lambda+1}},$$

$\omega_c$ is a center frequency of the fractional order controller, s is a Laplace transform of the output signal $y(t)$, $\lambda$ is a non-integer order of the set point tracking system, wherein $$\lambda = \frac{\pi - \varphi_m}{\pi/2} - 1,$$

and $\varphi_m$ is a phase margin of an open loop formed by the fractional order controller, the inverse static gain amplifier and the non-linear plant model.

Figure 14:
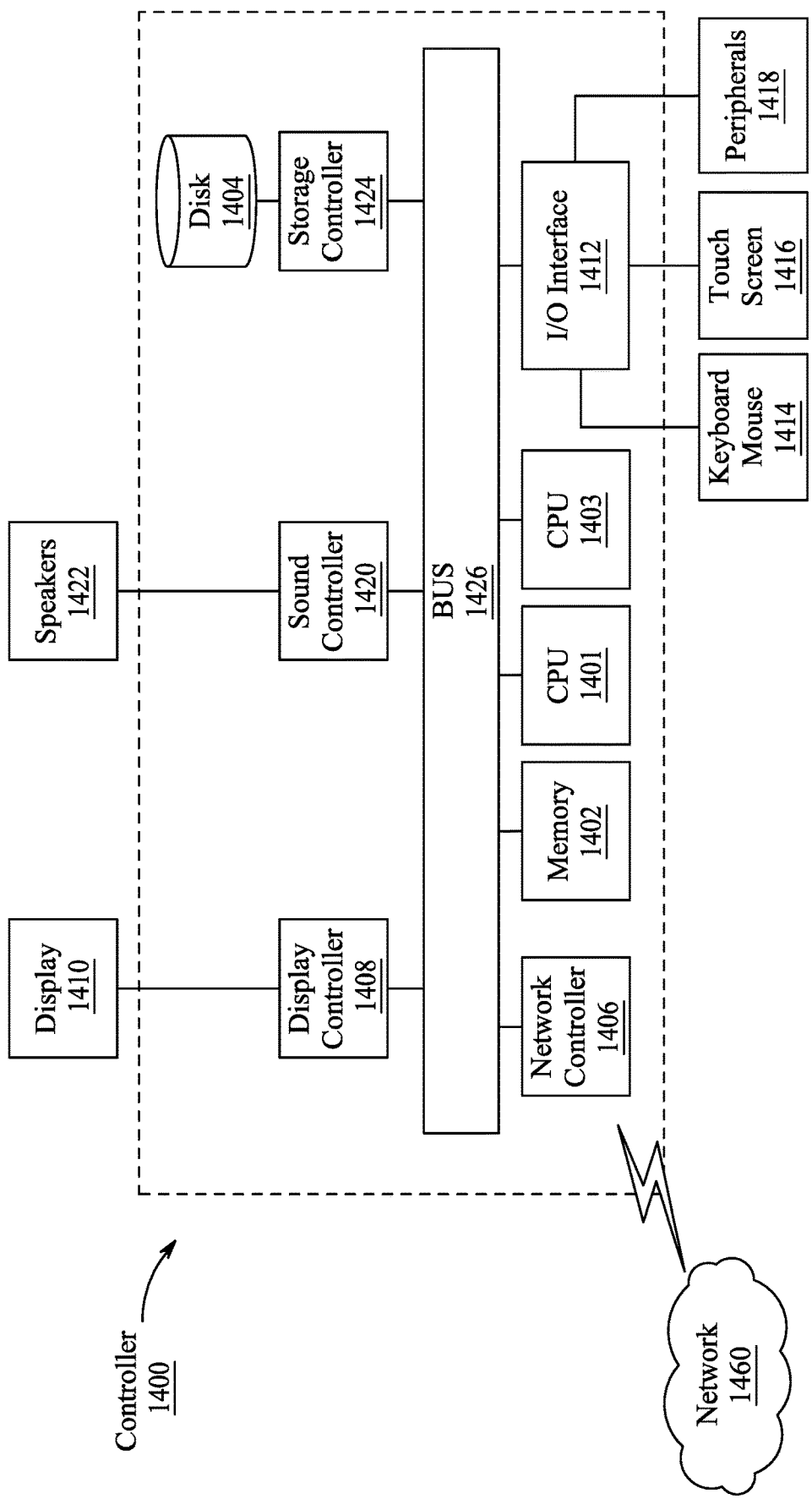
FIG. 14 is an illustration of a non-limiting example of details of computing hardware used in the computing system, according to certain embodiments.

FIG. 14 is an illustration of a non-limiting example of details of computing hardware used in the computing system, according to exemplary aspects of the present disclosure. In FIG. 14, a controller 1400 is described which is a computing device (for example, the ESO (416, 514) and/or the fractional order controller 504) and includes a CPU 1401 which performs the processes described above/below. The process data and instructions may be stored in memory 1402. These processes and instructions may also be stored on a storage medium disk 1404 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU 1401, 1403 and an operating system such as Microsoft Windows 7, Microsoft Windows 10, UNIX, Solaris, LINUX, Apple MAC-OS, and other systems known to those skilled in the art.

The hardware elements in order to achieve the computing device may be realized by various circuitry elements, known to those skilled in the art. For example, CPU 1401 or CPU 1403 may be a Xenon or Core processor from Intel of America or an Opteron processor from AMD of America, or may be other processor types that would be recognized by one of ordinary skill in the art. Alternatively, the CPU 1401, 1403 may be implemented on an FPGA, ASIC, PLD or using discrete logic circuits, as one of ordinary skill in the art would recognize. Further, CPU 1401, 1403 may be implemented as multiple processors cooperatively working in parallel to perform the instructions of the inventive processes described above.

The computing device in FIG. 14 also includes a network controller 1406, such as an Intel Ethernet PRO network interface card from Intel Corporation of America, for interfacing with network 1460. As can be appreciated, the network 1460 can be a public network, such as the Internet, or a private network such as an LAN or WAN network, or any combination thereof and can also include PSTN or ISDN sub-networks. The network 1460 can also be wired, such as an Ethernet network, or can be wireless such as a cellular network including EDGE, 3G and 4G wireless cellular systems. The wireless network can also be WiFi, Bluetooth, or any other wireless form of communication that is known.

The computing device further includes a display controller 1408, such as a NVIDIA GeForce GTX or Quadro graphics adaptor from NVIDIA Corporation of America for interfacing with display 1410, such as a Hewlett Packard HPL2445w LCD monitor. A general purpose I/O interface 1412 interfaces with a keyboard and/or mouse 1414 as well as a touch screen panel 1416 on or separate from display 1410. General purpose I/O interface also connects to a variety of peripherals 1418 including printers and scanners, such as an OfficeJet or DeskJet from Hewlett Packard.

A sound controller 1420 is also provided in the computing device such as Sound Blaster X-Fi Titanium from Creative, to interface with speakers/microphone 1422 thereby providing sounds and/or music.

The general purpose storage controller 1424 connects the storage medium disk 1404 with communication bus 1426, which may be an ISA, EISA, VESA, PCI, or similar, for interconnecting all of the components of the computing device. A description of the general features and functionality of the display 1410, keyboard and/or mouse 1414, as well as the display controller 1408, storage controller 1424, network controller 1406, sound controller 1420, and general purpose I/O interface 1412 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

The above-described hardware description is a non-limiting example of corresponding structure for performing the functionality described herein.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A set point tracking system for an $n^{th}$ order integer plant, comprising:
   a set point tracking loop including:
      a first multiplier configured to receive an input signal, r(t), and a first negative feedback signal, $z_1(t)$, and generate a first feedback compensated input signal;
      a fractional order controller connected to the first multiplier to receive the first feedback compensated input signal and generate a set point modified signal, $u_0(t)$;
      a second multiplier configured to receive the set point modified signal, $u_0(t)$, and a second negative feedback signal, $z_3(t)$, and generate a second feedback compensated input signal;
      an inverse static gain amplifier, $b_0^{-1}$, configured to receive the second feedback compensated input signal and generate a process variable, u(t);
      a third multiplier configured to receive the process variable, u(t), and a disturbance, d, and generate a disturbed process variable;
      a non-linear plant model configured to receive the disturbed process variable and generate an output signal, y(t); and
      an extended state observer configured to receive the process variable, u(t), and the output signal, y(t), and generate the first negative feedback signal, $z_1(t)$, and the second negative feedback signal, $z_3(t)$,
   wherein the fractional order controller includes:
      a proportional integral derivative, PID, controller configured to generate an integer derivative;
      a fractional order filter, FOF, operatively connected to the PID controller, the FOF configured to generate a fractional order derivative from the integer derivative;
      an integer order filter; and
      a computing circuitry including a memory and at least one processor, the processor having program instructions configured to cascade the fractional order derivative with the integer order filter to generate the set point modified signal, $u_0(t)$,
   wherein the non-linear plant model comprises:
      a cart;
      a track configured to confine the cart to linear movement;
      a first pendulum and a second pendulum connected to the cart, the first pendulum and the second pendulum configured to generate the disturbance, d, in the linear movement by swinging when the cart is moved;
      a DC motor;
      a belt connected to the DC motor and the cart;
      a first optical encoder configured to measure a position of the cart;
      a second optical encoder configured to measure a first angle of the first pendulum;
      a third optical encoder configured to measure a second angle of the second pendulum; and
   wherein the fractional order controller is configured to generate control signals for the DC motor, wherein the control signals are configured to move the cart along the track with minimum disturbance.

2. The set point tracking system of claim 1, wherein a transfer function, C(s), of the fractional order controller is given by:

$$C(s) = \frac{s^{n-2}}{(1+Ts)^{n-2}} \frac{1}{\tau_c} s^{1-\lambda}$$

where T is a time constant of the integer order filter of the fractional order controller, $\tau_c$ is a time constant of the set point tracking loop given by $$\tau_c = \frac{1}{\omega_c^{\lambda+1}},$$

$\omega_m$ is a center frequency of the fractional order controller, s is a Laplace transform of the output signal y(t), λ is a non-integer order of the set point tracking system, wherein $$\lambda = \frac{\pi - \varphi_m}{\pi/2} - 1,$$

$\varphi_m$ is a phase margin of an open loop formed by the fractional order controller, the inverse static gain amplifier and the non-linear plant model, and wherein n is a positive or negative $n^{th}$ order integer, or zero.

3. The set point tracking system of claim 2, wherein the fractional order controller is configured to determine the non-integer order, λ, by imposing a closed loop step response which has an iso-damping property.

4. The set point tracking system of claim 3, wherein the fractional order controller is configured to impose the iso-damping property by applying Bode's ideal transfer function as a reference model to a closed loop formed by the fractional order controller, the inverse static gain amplifier, the non-linear plant model, and the extended state observer, wherein Bode's ideal transfer function, $G_{cl}(s)$, is given by:

$$G_{cl}(s) = \frac{1}{1 + \tau_c s^{\lambda+1}(1+Ts)^{n-2}}$$

5. The set point tracking system of claim 1, further comprising:
wherein the fractional order controller is configured to generate the control signals by applying a transfer function, C(s), of the fractional order controller to an input motor signal, wherein the transfer function, C(s) is given by:

$$C(s) = \frac{s^{n-2}}{(1+Ts)^{n-2}} \frac{1}{\tau_c} s^{1-\lambda}$$

where T is a time constant of the integer order filter of the fractional order controller, $\tau_c$ is a time constant of the set point tracking loop given by $$\tau_c = \frac{1}{\omega_c^{\lambda+1}},$$

$\omega_c$ is a center frequency of the fractional order controller, s is a Laplace transform of the output signal y(t), $\lambda$ is a non-integer order of the set point tracking system, wherein $$\lambda = \frac{\pi - \varphi_m}{\pi/2} - 1,$$

and $\varphi_m$ is a phase margin of an open loop formed by the fractional order controller, the inverse static gain amplifier and the non-linear plant model, and n is a positive or negative $n^{th}$ order integer, or zero.

6. A method for set point tracking control of an $n^{th}$ order integer control system, comprising:
receiving, by a first multiplier, an input signal, r(t);
generating, by the first multiplier, a first feedback compensated input signal from the input signal, r(t), and a first negative feedback signal, $z_1(t)$;
generating, by a fractional order controller, a set point modified signal, $u_0(t)$ from the first feedback compensated input signal;
receiving, by a second multiplier, the set point modified signal, $u_0(t)$, and a second negative feedback signal, $z_3(t)$;
generating, by the second multiplier, a second feedback compensated input signal from the set point modified signal, $u_0(t)$, and the second negative feedback signal, $z_3(t)$;
generating, by an inverse static gain amplifier, $b_0^{-1}$, a process variable, u(t) from the second feedback compensated input signal;
receiving, by a third multiplier, the process variable, u(t), and a disturbance, d;
generating, by the third multiplier, a disturbed process variable from the process variable, u(t), and the disturbance, d;
applying the disturbed process variable to a non-linear plant model and generating an output signal, y(t);
receiving, by an extended state observer, the process variable, u(t), and the output signal, y(t);
generating, by the extended state observer, the first negative feedback signal, $z_1(t)$, and the second negative feedback signal, $z_3(t)$;
generating the set point modified signal, $u_0(t)$, by applying a transfer function, C(s), of the fractional order controller to the first feedback compensated input signal, wherein the transfer function, C(s), is given by:

$$C(s) = \frac{s^{n-2}}{(1+Ts)^{n-2}} \frac{1}{\tau_c} s^{1-\lambda}$$

where T is a time constant of an integer order filter of the fractional order controller, is a time constant of the set point tracking loop given by $$\tau_c = \frac{1}{\omega_c^{\lambda+1}},$$

$\omega_c$ is a center frequency of the fractional order controller, s is a Laplace transform of the output signal y(t), $\lambda$ is a non-integer order of a set point tracking system, wherein $$\lambda = \frac{\pi - \varphi_m}{\pi/2} - 1,$$

$\varphi_m$ is a phase margin of an open loop formed by the fractional order controller, the inverse static gain amplifier and the non-linear plant model, and n is a positive or negative $n^{th}$ order integer, or zero;
generating, by the fractional order controller, control signals for a DC motor, wherein the control signals are configured to move a cart along a track; and
compensating for the disturbance, d, generated by swinging pendulums attached to the cart.

7. The method of claim 6, further comprising:
generating, by a proportional integral derivative, PID, controller, an integer derivative;
generating, by a fractional order filter, FOF, a fractional order derivative from the integer derivative; and
cascading the fractional order derivative with an integer order filter to generate the set point modified signal, $u_0(t)$.

8. The method of claim 6, further comprising:
determining the non-integer order, $\lambda$, by imposing a closed loop step response which has an iso-damping property.

9. The method of claim 8, further comprising:
imposing the iso-damping property by applying Bode's ideal transfer function, $G_{cl}(s)$, as a reference model to a closed loop formed by the fractional order controller, the inverse static gain amplifier, the non-linear plant model, and the extended state observer, wherein Bode's ideal transfer function, $G_{cl}(s)$, is given by:

$$G_{cl}(s) = \frac{1}{1 + \tau_c s^{\lambda+1}(1+Ts)^{n-2}}$$

10. The method of claim 6, further comprising:
generating the control signals by applying a transfer function, C(s), of the fractional order controller to an input motor signal, wherein the transfer function, C(s) is given by:

$$C(s) = \frac{s^{n-2}}{(1+Ts)^{n-2}} \frac{1}{\tau_c} s^{1-\lambda}$$

where T is the time constant of the integer order filter of the fractional order controller, $\tau_c$ is the time constant of the set point tracking loop given by $$\tau_c = \frac{1}{\omega_c^{\lambda+1}},$$

$\omega_c$ is the center frequency of the fractional order controller, s is the Laplace transform of the output signal y(t), $\lambda$ is the non-integer order of the set point tracking system, wherein $$\lambda = \frac{\pi - \varphi_m}{\pi/2} - 1,$$

and $\varphi_m$ is the phase margin of the open loop formed by the fractional order controller, the inverse static gain amplifier and the non-linear plant model.

11. A non-transitory computer readable medium having instructions stored therein that, when executed by one or more processors, cause the one or more processors to perform a method of:
receiving, by a first multiplier, an input signal, r(t);
generating, by the first multiplier, a first feedback compensated input signal from the input signal, r(t), and a first negative feedback signal, $z_1$(t);
generating, by a fractional order controller, a set point modified signal, $u_0$(t) from the first feedback compensated input signal;
receiving, by a second multiplier, the set point modified signal, $u_0$(t), and a second negative feedback signal, $z_3$(t);
generating, by the second multiplier, a second feedback compensated input signal from the set point modified signal, $u_0$(t), and the second negative feedback signal, $z_3$(t);
generating, by an inverse static gain amplifier, $b_0^{-1}$, a process variable, u(t) from the second feedback compensated input signal;
receiving, by a third multiplier, the process variable, u(t), and a disturbance, d;
generating, by the third multiplier, a disturbed process variable from the process variable, u(t), and the disturbance, d;
applying the disturbed process variable to a non-linear plant model and generating an output signal, y(t);
receiving, by an extended state observer, the process variable, u(t), and the output signal, y(t);
generating, by the extended state observer, the first negative feedback signal, $z_1$(t), and the second negative feedback signal, $z_3$(t),
generating the set point modified signal, $u_0$(t), by applying a transfer function, C(s), of the fractional order controller to the first feedback compensated input signal, wherein the transfer function, C(s), is given by:

$$C(s) = \frac{s^{n-2}}{(1+Ts)^{n-2}} \frac{1}{\tau_c} s^{1-\lambda}$$

where T is a time constant of an integer order filter of the fractional order controller, $\tau_c$ is a time constant of the set point tracking loop given by $$\tau_c = \frac{1}{\omega_c^{\lambda+1}},$$

$\omega_c$ is a center frequency of the fractional order controller, s is a Laplace transform of the output signal y(t), $\lambda$ is a non-integer order of a set point tracking system, wherein $$\lambda = \frac{\pi - \varphi_m}{\pi/2} - 1,$$

$\varphi_m$ is a phase margin of an open loop formed by the fractional order controller, the inverse static gain amplifier and the non-linear plant model, and n is a positive or negative $n^{th}$ order integer, or zero,
generating, by the fractional order controller, control signals for a DC motor, wherein the control signals are configured to move a cart along a track; and
compensating for the disturbance, d, generated by swinging pendulums attached to the cart.

12. The non-transitory computer readable medium method of claim 11, further comprising:
generating, by a proportional integral derivative, PID, controller, an integer derivative;
generating, by a fractional order filter, FOF, a fractional order derivative from the integer derivative; and
cascading the fractional order derivative with an integer order filter to generate the set point modified signal, $u_0$(t).

13. The non-transitory computer readable medium method of claim 11, further comprising:
determining the non-integer order, $\lambda$, by imposing a closed loop step response which has an iso-damping property, wherein imposing the iso-damping property includes applying Bode's ideal transfer function, $G_{cl}$(s), as a reference model to a closed loop formed by the fractional order controller, the inverse static gain amplifier, the non-linear plant model, and the extended state observer, wherein Bode's ideal transfer function, $G_{cl}$(s), is given by:

$$G_{cl}(s) = \frac{1}{1+\tau_c s^{\lambda+1}(1+Ts)^{n-2}}$$

14. The non-transitory computer readable medium method of claim 11, further comprising:
generating the control signals by applying a transfer function, C(s), of the fractional order controller to an input motor signal, wherein the transfer function, C(s) is given by:

$$C(s) = \frac{s^{n-2}}{(1+Ts)^{n-2}} \frac{1}{\tau_c} s^{1-\lambda}$$

where T is the time constant of the integer order filter of the fractional order controller, $\tau_c$ is the time constant of the set point tracking loop given by $$\tau_c = \frac{1}{\omega_c^{\lambda+1}},$$

$\omega_c$ is the center frequency of the fractional order controller, s is the Laplace transform of the output signal y(t), $\lambda$ is the non-integer order of the set point tracking system, wherein $$\lambda = \frac{\pi - \varphi_m}{\pi/2} - 1,$$

and $\varphi_m$ is the phase margin of the open loop formed by the fractional order controller, the inverse static gain amplifier and the non-linear plant model, and n is the positive or negative $n^{th}$ order integer, or zero.

* * * * *